United States Patent [19]

Terashima

[11] Patent Number: 5,495,124
[45] Date of Patent: Feb. 27, 1996

[54] SEMICONDUCTOR DEVICE WITH INCREASED BREAKDOWN VOLTAGE

[75] Inventor: Tomohide Terashima, Hyogo, Japan

[73] Assignee: Mitsubishi Denki Kabushiki Kaisha, Tokyo, Japan

[21] Appl. No.: 141,659

[22] Filed: Oct. 26, 1993

[30] Foreign Application Priority Data

Jul. 7, 1993 [JP] Japan .................................. 5-168089
Oct. 8, 1993 [JP] Japan .................................. 5-253407

[51] Int. Cl.$^6$ .................................................. H01L 29/36
[52] U.S. Cl. ........................ 257/550; 257/369; 257/409; 257/545
[58] Field of Search ................................. 257/550, 545, 257/369, 372, 409, 491, 492, 370, 500

[56] References Cited

U.S. PATENT DOCUMENTS

| | | | |
|---|---|---|---|
| 3,460,006 | 8/1969 | Strull | 257/545 |
| 3,622,842 | 11/1971 | Oberai | 257/545 |
| 5,218,228 | 6/1993 | Williams et al. | 257/370 |

FOREIGN PATENT DOCUMENTS

| | | | |
|---|---|---|---|
| 54-11682 | 1/1979 | Japan | 257/550 |
| 2-170571 | 7/1990 | Japan | 257/372 |

OTHER PUBLICATIONS

Terashima et al., "Development of Structure of 600V HIVC", published Oct. 29, 1992.
Proceedings of The 5th International Symposium on Power Semiconductor Devices and ICs, ISPSD '93, published May 18, 1993.

*Primary Examiner*—Sara W. Crane
*Assistant Examiner*—Courtney A. Bowers
*Attorney, Agent, or Firm*—Lowe, Price, LeBlanc & Becker

[57] ABSTRACT

A low concentration impurity region 6 of a second conductivity type is formed to cover lower portion of a high concentration impurity region 8 of the second conductivity type. Consequently, impurity concentration gradient between the high concentration impurity region 8 of the second conductivity type and the low concentration impurity layer 2 of a first conductivity type can be made moderate to relax the electric field, which leads to provision of higher breakdown voltage of the semiconductor device. Further, the depth of impurity diffusion of the low concentration impurity region 6 of the second conductivity type from the main surface of the low concentration impurity layer 2 of the first conductivity type is made at least three times the depth of impurity diffusion of the high concentration impurity region 8 of the second conductivity type from the main surface of the low concentration impurity layer 2 of the first conductivity type. Therefore, minimum dimensions necessary for suppressing the electric field can be set in the semiconductor device, and therefore the semiconductor device comes to have higher breakdown voltage efficiently while not preventing miniaturization.

6 Claims, 26 Drawing Sheets

SEMICONDUCTOR DEVICE WITH INCREASED BREAKDOWN VOLTAGE

BACKGROUND OF THE INVENTION

1. Field of the Invention

The present invention relates to semiconductor devices and manufacturing method thereof, and, more specifically, to a semiconductor device breakdown voltage of which can be increased, and to the method of manufacturing the same.

2. Description of the Background Art

Recently, high voltage integrated circuits (HVIC) including CMOS transistors, bipolar transistors, high voltage isolating structure as well as level shift function by high voltage devices have been much developed in order to realize lower cost of power control system, lower power consumption and down sizing while providing higher performance.

FIG. 37 is a cross section showing a structure of a conventional CMOS transistor.

Referring to FIG. 37, an n⁻ epitaxial layer 10 is formed on a main surface of a p⁻ semiconductor substrate 2. An n⁺ buried impurity region 8 is formed enclosed by p⁻ semiconductor substrate 2 and n⁻ epitaxial layer 10.

A CMOS transistor is formed on the surface of n⁻ epitaxial layer 10 above n⁺ buried impurity region 8.

The CMOS transistor includes a p channel MOS transistor 28 and an n channel MOS transistor 38.

The p channel MOS transistor 28 includes a gate electrode 22 formed on the surface of n⁻ epitaxial layer 10 with a gate insulating film 20 interposed, and source/drain regions 24 and 26 of p type impurity regions formed at positions sandwiching, from left and right, the gate electrode 22.

The n channel MOS transistor 38 includes a gate electrode 32 formed on the surface of n⁻ epitaxial layer 10 with a gate insulating film 30 interposed therebetween, and source/drain regions 34 and 36 of n type impurity regions formed at positions sandwiching from left and right, the gate electrode 32 in a p⁻ impurity region 12 formed in n⁻ epitaxial layer 10.

At the surface of n⁻ epitaxial layer 10, the CMOS transistor is surrounded by an element isolating oxide film 18.

In the n⁻ epitaxial layer 10, an n⁺ collector wall 14 is provided to surround the CMOS transistor, which is in turn surrounded by a p type isolating region 16.

FIG. 38 is a schematic view showing a depletion layer generated in the semiconductor device of FIG. 37.

Referring to FIG. 38, assume that the potential of n⁺ buried impurity region 8 is made higher with respect to the semiconductor substrate 2.

At this time, a depletion layer is generated from the interface between p⁻ semiconductor substrate 2 and n⁺ buried impurity region 8 and from the pn junction between p⁻ semiconductor substrate 2 and n⁻ epitaxial layer 10 over the hatch region.

The electric field in the semiconductor device with this depletion layer formed will be described with reference to FIGS. 39 to 41.

FIG. 39 is a perspective view of n⁺ buried impurity region 8 which is cut at the interface between p⁻ semiconductor substrate 2 and n⁻ epitaxial layer 10.

It is assumed that the impurity concentration has been sufficiently lowered to increase the breakdown voltage of the p⁻ semiconductor substrate 2.

Referring to FIG. 38, the electric field in the direction (A–A' in the figure) perpendicular to the bottom surface of n⁺ buried impurity region 8 is constant in the region of p⁻ semiconductor substrate 2, as shown by the dotted line in FIG. 40.

Meanwhile, the electric field at the corner portion (the direction of B–B' in FIG. 39) of n⁺ buried impurity region 8 shows the maximum value at the pn junction portion between n⁺ buried impurity region 8 and p⁻ semiconductor substrate 2.

The internal electric field and the inclination of the electric field of n⁺ buried impurity region 8 and p⁻ semiconductor substrate 2 are represented, in approximation, by the following equations (5) and (6).

$$E = \frac{Q}{\left\{ \epsilon\theta\left(\frac{\pi l'x}{2} + x^2\right) \right\}} \quad (5)$$

$(x \geq r')$ $$\frac{dE}{dx} = \frac{-Q\left(\frac{\pi l'}{2} + 2x\right)}{\left(\epsilon\theta x^2 \left(\frac{\pi l'}{2} + x\right)\right)^2} \quad (6)$$

$(x \geq r')$

Here, it is assumed that the electric field at the pn junction interface at the corner portion of n⁺ buried impurity region 8 is constant.

In the above equations, Q represents the total of space charges on the side of n⁺ buried impurity region 8 where electric line of force passing through the hatch portion of FIG. 39 terminates, l' represents corner radius of n⁺ buried impurity region 8, and r' represents the depth of diffusion of n⁺ impurity region 3.

As can be seen from equations (5) and (6), at the corner portion, the electric field at the pn junction interface changes, and provides the maximum electric field at the interface of the pn junction.

Namely, the breakdown voltage of the semiconductor device as a whole is determined by this maximum value of the electric field.

FIG. 41 shows the relation between r' and the electric field.

FIG. 41 shows the change of the electric field E when r' is multiplied by α with the value of β', which is l'/r'=β', being changed to 0, 1 and 3, assuming that the value of the electric field E (x=r') is 1 when the size of l' in the perspective view of FIG. 39 is 0.

As can be seen from FIG. 41, when the value of α is set to 3 or more, the electric field can be suppressed to about 1/10 when β'=0.

If the value of α is set to be 3 or more with the value of β' being 1 or 3, the electric field can be further suppressed. In other words, by setting the value of α to 3 or more, that is, by increasing the depth of diffusion of n⁺ buried impurity region 8, the electric field generated in the semiconductor device can be suppressed to be small, and therefore a semiconductor device having high breakdown voltage can be provided.

However, when the depth of diffusion of n⁺ buried impurity region 8 is increased, the diffusion in the lateral direction also increases.

For example, referring to FIGS. 42 and 43, an isolation region per one npn transistor of a class having the breakdown voltage of about 30 V requires the area of $(16 \, \mu m + 25 \, \mu m \times 2) \, (40 \, \mu m + 25 \, \mu m \times 2) = 5940 \, \mu m^2.$ When the distance $X_j$ of $n^+$ buried impurity region 8 is tripled from 5 μm to 15 μm, it requires expansion of the size in the lateral direction of 10 μm.

Therefore, the isolation region would be $(16 \, \mu m + (25 \, \mu m + 10 \, \mu m) \times 2) \times (40 \, \mu m + (25 \, \mu m + 10 \, \mu m) \times 2) = 9460 \, \mu m^2,$ and therefore the area of the isolating region per one npn transistor would be increased by about $(9460/5940) \times 100 = 159.3\%.$ This increase of the area is against the recent demand of miniaturizing the semiconductor devices, and therefore the increase of the depth of diffusion of the $n^+$ buried impurity region cannot be adopted as a method of suppressing the electric field.

SUMMARY OF THE INVENTION

Therefore, an object of the present invention is to provide a semiconductor device of which breakdown voltage can be increased.

Another object of the present invention is to provide a semiconductor device which can be miniaturized.

A further object of the present invention is to provide a method of manufacturing a semiconductor device of which breakdown voltage can be increased.

A still further object of the present invention is to provide a method of manufacturing a semiconductor device which can be miniaturized.

In order to attain the above described objects, the semiconductor device in accordance with the present invention includes a low concentration impurity layer of a first conductivity type having a main surface; a low concentration impurity layer of a second conductivity type formed on the main surface of the low concentration impurity layer of the first conductivity type; a high concentration impurity region of the second conductivity type formed on a prescribed region of the main surface of the low concentration impurity layer of the first conductivity type so as to be enclosed by the low concentration impurity layer of the first conductivity type and the low concentration impurity layer of the second conductivity type; and a low concentration impurity region of the first conductivity type formed in the low concentration impurity layer of the first conductivity type so as to cover lower portion of the high concentration impurity region of the second conductivity type.

According to the semiconductor device, the low concentration impurity region of the second conductivity type is formed to cover the high concentration impurity region of the second conductivity type.

Therefore, the impurity concentration gradually changes from the high concentration impurity region of the second conductivity type to the low concentration impurity region of the first conductivity type.

Consequently, the extent of the depletion layer formed at the interface between the high concentration impurity region of the second conductivity type and the low concentration impurity layer of the first conductivity type can be suppressed.

In the present invention, preferably, the depth of impurity diffusion of the low concentration impurity region of the second conductivity type from the main surface of the low concentration impurity layer of the first conductivity type is set to be three times or more than the depth of impurity diffusion of the high concentration impurity region of the second conductivity type from the main surface of the low concentration impurity layer of the first conductivity type.

Consequently, the depth of impurity diffusion of the low concentration impurity region of the second conductivity type and the depth of impurity diffusion of the high concentration impurity region of the second conductivity type can be set to the minimum values necessary for suppressing the electric field.

As a result, breakdown voltage of the semiconductor device can be increased efficiently, while not preventing miniaturization of the device.

Therefore, a semiconductor device having high performance and high reliability can be provided.

In the present invention, more preferably, the depth of impurity diffusion of the low concentration impurity region of the second conductivity type from the main surface of the low concentration impurity layer of the first conductivity type is, in accordance with a log scale, the distance from a point at which the concentration of the high concentration impurity region of the second conductivity type assumes the maximum value from the interface of the low concentration impurity layer of the first conductivity type. Therefore, the depth of impurity diffusion of the low concentration impurity region of the second conductivity type and the depth of impurity diffusion of the high concentration impurity region of the second conductivity type can be set to the minimum values necessary for suppressing the electric field.

Therefore, breakdown voltage of the semiconductor device can be increased efficiently, while not preventing miniaturization of the device.

Therefore, a semiconductor device having high performance and high reliability can be provided.

More preferably, in the present invention, the depth of impurity diffusion of the high concentration impurity region of the second conductivity type from the main surface of the low concentration impurity layer of the first conductivity type is, in accordance with a log scale, a distance from a point where the concentration of the high concentration impurity region of the second conductivity type assumes the maximum value to the point at which quadratic differential of the impurity concentration assumes a positive maximum value.

Therefore, the depth of impurity diffusion of the low concentration impurity region of the second conductivity type and the depth of impurity diffusion of the high concentration impurity region of the second conductivity type can be set to the minimum values necessary for suppressing the electric field. Consequently, breakdown voltage of the semiconductor device can be increased efficiently, while not preventing miniaturization of the device.

Therefore, a semiconductor device having high performance and high reliability can be provided.

In the present invention, more preferably, the high concentration impurity region of the second conductivity type has a closed planar pattern including corners, and the corner is formed to have an arc of which radius is at least three times the depth of impurity diffusion of the high concentration impurity region of the second conductivity type from the main surface of the low concentration impurity layer of the first conductivity type. Consequently, the depth of impurity diffusion can be set to the minimum value necessary for suppressing the electric field at the corner portion of the high concentration impurity region of the second conductivity type. Consequently, the corner portion of the high concentration impurity region of the second conductivity type comes to have high breakdown voltage, and hence the semiconductor device as a whole comes to have higher breakdown voltage, while not preventing the miniaturization of the semiconductor device.

More preferably, in the present invention, the low concentration impurity region of the second conductivity type has a closed planar pattern including corners, and the corners are each formed to have an arc of which radius is at least three times the depth of impurity diffusion of the low concentration impurity region of the second conductivity type from the main surface of the low concentration impurity layer of the first conductivity type.

Consequently, the depth of impurity diffusion can be set to the minimum value necessary for suppressing the electric field at the corner portion of the low concentration impurity region of the second conductivity type.

Consequently, the corner of the low concentration impurity region of the second conductivity type comes to have higher breakdown voltage, and hence the semiconductor device as a whole comes to have higher breakdown voltage, while not preventing miniaturization of the semiconductor device.

In the present invention, more preferably, the high concentration impurity region of the second conductivity type and the low concentration impurity region of the second conductivity type have closed planar patterns including corners, and the difference between radii of the arcs of the corners of the high concentration impurity region of the second conductivity type and the low concentration impurity region of the second conductivity type is set such that it is greater than the difference between the depth of impurity diffusion of the low concentration impurity region of the second conductivity type from the main surface of the low concentration impurity layer of the first conductivity type and the depth of impurity diffusion of the high concentration impurity region of the second conductivity type from the main surface of the low concentration impurity layer of the first conductivity type.

Consequently, the electric field at the corners of the high concentration impurity region of the second conductivity type and the low concentration impurity region of the second conductivity type can be relaxed.

Consequently, the corners of the low concentration impurity region of the second conductivity type and the high concentration impurity region of the second conductivity type come to have higher breakdown voltage, and hence the semiconductor device as a whole comes to have higher breakdown voltage, while not preventing miniaturization of the semiconductor device.

In order to attain the above described objects, the method of manufacturing the semiconductor device in accordance with the present invention includes the following steps.

At first, an impurity of the second conductivity type is introduced to a prescribed region of the main surface of the low concentration impurity layer of the first conductivity type by using a first photomask having a prescribed pattern, and thus a low concentration impurity region of the second conductivity type is formed. Thereafter, an impurity of the second conductivity type is introduced to a prescribed region of the main surface of the low concentration impurity layer of the first conductivity type by using a second mask having a prescribed pattern such that it is covered by the low concentration impurity region of the second conductivity type, and thus the high concentration impurity region of the second conductivity type is formed.

Then, the low concentration impurity region of the second conductivity type is formed by epitaxial growth on the main surface of the low concentration impurity layer of the first conductivity type.

According to this method of manufacturing, the low concentration impurity region of the second conductivity type is formed to cover the high concentration impurity region of the second conductivity type.

Accordingly, the concentration of impurity changes gradually from the high concentration impurity region of the second conductivity type to the low concentration impurity layer of the first conductivity type.

Consequently, the extent of depletion layer formed at the interface between the high concentration impurity region of the second conductivity type and the low concentration impurity layer of the first conductivity type can be suppressed.

In the present invention, more preferably, the position of the first mark is displaced from the interface of the low concentration impurity layer of the first conductivity type by a length which is equal to the depth of impurity diffusion of the low concentration impurity region of the second conductivity type from the main surface of the low concentration impurity layer of the first conductivity type.

Consequently, the depth of diffusion can be set to the minimum value necessary for suppressing the electric field at the corner portion of the low concentration impurity region of the second conductivity type.

Consequently, the corner of the low concentration impurity region of the second conductivity type comes to have higher breakdown voltage, and hence the semiconductor device as a whole comes to have higher breakdown voltage, while not preventing miniaturization of the semiconductor device.

In the present invention, more preferably, the position of the second mask is displaced from the position at which the value of quadratic differential of the impurity concentration assumes a positive maximum value in accordance with the log scale by a length which is equal to the depth of impurity diffusion of the high concentration impurity region of the second conductivity type from the main surface of the low concentration impurity layer of the first conductivity type.

Consequently, the depth of diffusion can be set to the minimum value necessary for suppressing the electric field at the corner portion of the high concentration impurity region of the second conductivity type.

Consequently, the corner of the high concentration impurity region of the second conductivity type comes to have higher breakdown voltage and hence the semiconductor device as a whole comes to have a higher breakdown voltage, while not preventing miniaturization of the semiconductor device.

In the present invention, preferably, the step of forming the low concentration impurity region of the second conductivity type and the step of forming the high concentration impurity region of the second conductivity type include the step of introducing impurities such that the depth of impurity diffusion of the low concentration impurity region of the second conductivity type from the main surface of the low concentration impurity layer of the first conductivity type is set to be at least three times the depth of impurity diffusion of the high concentration impurity region of the second conductivity type from the main surface of the low concentration impurity layer of the first conductivity type.

Consequently, the depth of impurity diffusion of the low concentration impurity region of the second conductivity type and the depth of impurity diffusion of the high concentration impurity region of the second conductivity type can be set to the minimum values necessary for suppressing the electric field.

Consequently, breakdown voltage of the semiconductor device can be increased efficiently, while not preventing miniaturization of the device.

Still more preferably, in the present invention, the step of forming the high concentration impurity region of the second conductivity type includes the step of forming this region to have a closed planar pattern including corners, each corner having an arc of which radius is at least three times the depth of impurity diffusion of the high concentration impurity region of the second conductivity type from the main surface of the low concentration impurity layer of the first conductivity type.

Therefore, the depth of diffusion can be set to the minimum value necessary for suppressing the electric field at the corner of the high concentration impurity region of the second conductivity type.

Consequently, the corners of the high concentration impurity regions of the second conductivity type comes to have high breakdown voltage, and hence the semiconductor device as a whole comes to have higher breakdown voltage, and, while not preventing miniaturization of the semiconductor device.

Still more preferably, in the present invention, the step of forming the low concentration impurity region of the second conductivity type includes the steps of forming this region to have a closed planar pattern including corners, each corner having an arch of which radius is at least three times the depth of impurity diffusion of the low concentration impurity region of the second conductivity type from the main surface of the low concentration impurity layer of the first conductivity type.

Consequently, the depth of diffusion can be set to the minimum value necessary for suppressing the electric field at the corner portion of the low concentration impurity region of the second conductivity type.

Consequently, the corners of the low concentration impurity region of the second conductivity type comes to have higher breakdown voltage, and hence the semiconductor device as a whole comes to have higher breakdown voltage, while not preventing miniaturization of the device.

Still more preferably, in the present invention, the step of forming the high concentration impurity region of the second conductivity type and the step of forming the low concentration impurity region of the second conductivity type include the steps of forming these regions to have closed planar patterns including corners such that the difference in length between the radii of the arc at the corners of the high concentration impurity region of the second conductivity type and the low concentration impurity region of the second conductivity type is made longer than the difference between the depth of impurity diffusion of the low concentration impurity region of the second conductivity type from the main surface of the low concentration impurity layer of the first conductivity type and the depth of impurity diffusion of the high concentration impurity region of the second conductivity type from the main surface of the low concentration impurity layer of the first conductivity type.

Accordingly, the electric fields at the corners of the high concentration impurity region of the second conductivity type and the low concentration impurity region of the second conductivity type can be relaxed.

As a result, the corners of the low concentration impurity region of the second conductivity type and the high concentration impurity region of the second conductivity type come to have higher breakdown voltages and hence the semiconductor device as a whole comes to have higher breakdown voltage, not preventing miniaturization of the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment of the semiconductor device in accordance with the present invention and the method of manufacturing the same will be described with reference to the figures.

Figure 1:
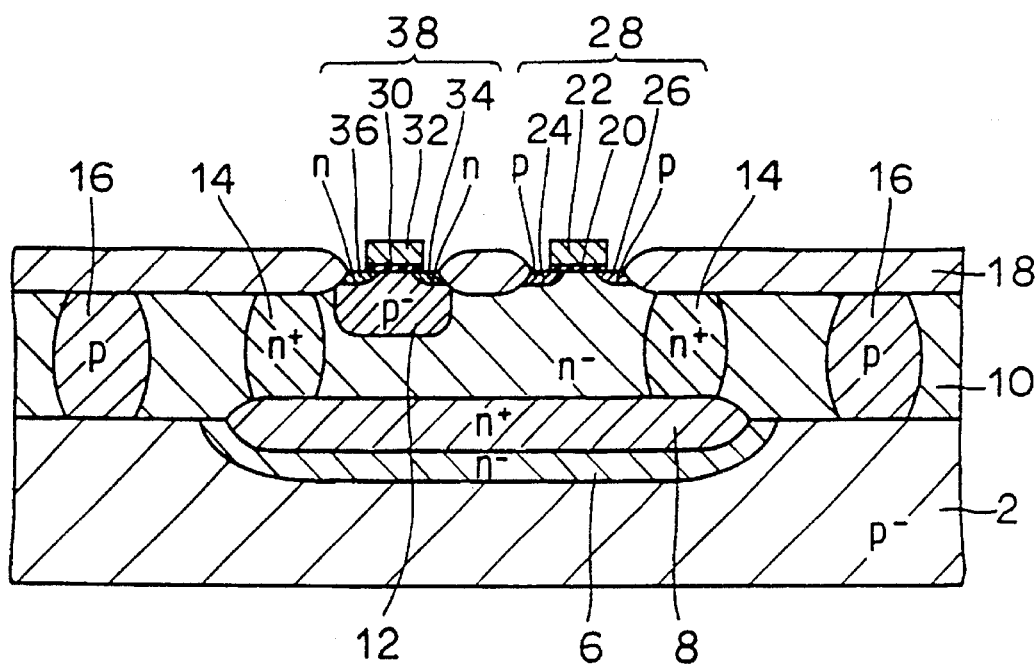
FIG. 1 is a cross section of a semiconductor device in accordance with a first embodiment of the present invention.

First, referring to FIG. 1, an $n^-$ epitaxial layer 10 is formed on a main surface of a $p^-$ semiconductor substrate 2. An $n^+$ buried impurity region 8 is formed at a prescribed region of the main surface of the $p^-$ semiconductor substrate 2, enclosed by $p^-$ semiconductor substrate 2 and $n^-$ epitaxial layer 10.

Further, an $n^-$ buried impurity region 6 is provided in $p^-$ semiconductor substrate 2 to cover lower portion of $n^+$ buried impurity region 8.

A CMOS transistor is formed at the surface of $n^-$ epitaxial layer 10 above $n^+$ buried impurity region 8. The CMOS transistors includes a p channel MOS transistor 28 and an n channel MOS transistor 38.

The p channel MOS transistor 28 includes a gate electrode 22 formed on the surface of $n^-$ epitaxial layer 10 with a gate insulating film 20 posed therebetween, and source/drain regions 24, 26 of p type impurity regions formed sandwiching, from left and right, the gate electrode 22.

The n channel MOS transistor 38 includes a gate electrode 32 formed on the surface of $n^-$ epitaxial layer 10 with a gate insulating film 30 posed therebetween, and source/drain regions 34, 36 of n type impurity regions formed at positions sandwiching, from left and right, the gate electrode 32 in a $p^-$ impurity region 12 formed in $n^-$ epitaxial layer 10.

At the surface of $n^-$ epitaxial layer 10, the CMOS transistor is surrounded by an element isolating oxide film 18.

In $n^-$ epitaxial layer 10, an $n^+$ collector wall 14 is provided to surround the CMOS transistor, and a p type insulating region 16 is formed to surround the collector wall 14.

Figure 2:
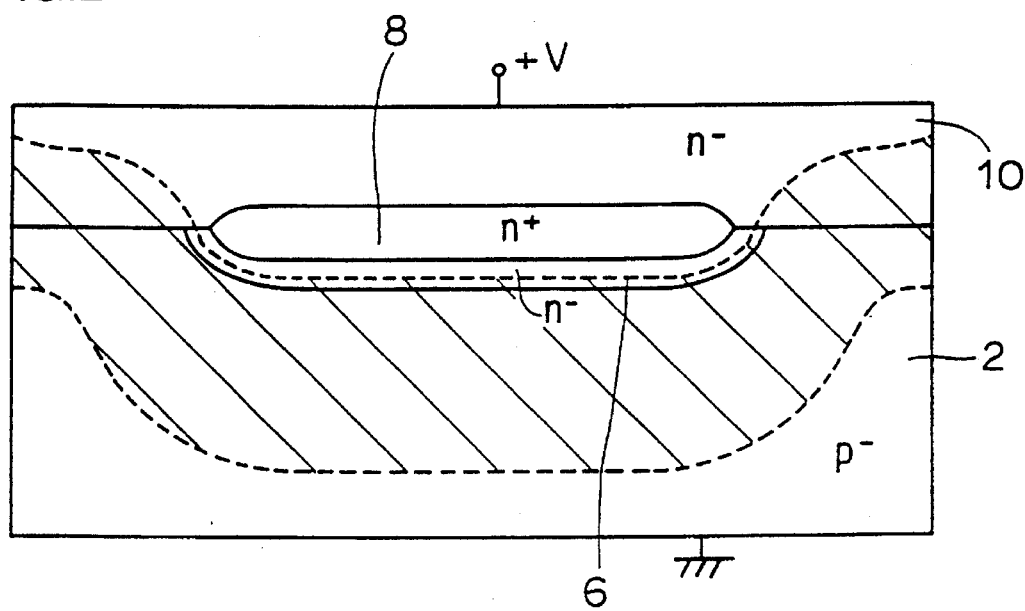
FIG. 2 is a schematic view showing a depletion layer generated in the semiconductor device.

FIG. 2 is a schematic view showing the state of generation of a depletion layer in the semiconductor device shown in FIG. 1.

Referring to FIG. 2, assume that the potential at $n^+$ buried impurity region 8 becomes higher than that of $p^-$ semiconductor substrate 2.

In this case, the depletion layer is formed from the interface between $p^-$ semiconductor substrate 2 and $n^+$ buried impurity region 8 and from the pn junction between $p^-$ semiconductor substrate 2 and $n^-$ epitaxial layer 10 over the hatch regions.

Figure 29:
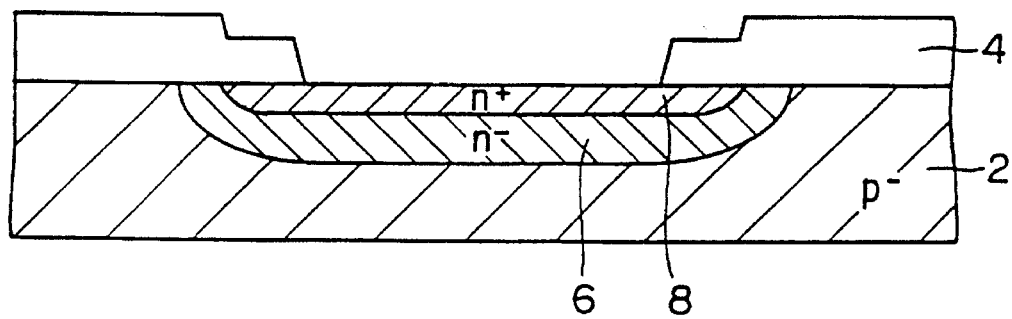
Figure 30:
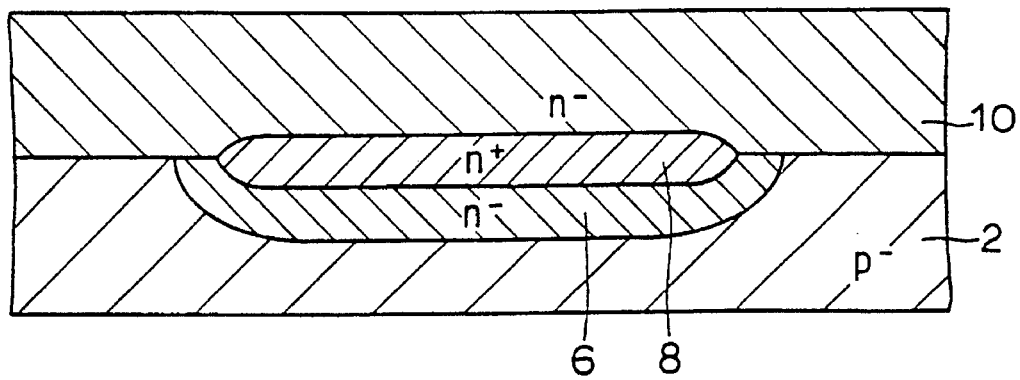

As compared with the state of the prior art shown in FIG. 29, the extent of the depletion layer can be suppressed, since there is provided $n^-$ buried impurity region 6.

The method of manufacturing the semiconductor device shown in FIG. 1 will be described with reference to FIGS. 3 to 10.

FIGS. 3 to 10 are cross sections showing the steps of manufacturing the semiconductor device shown in FIG. 1.

Figure 3:
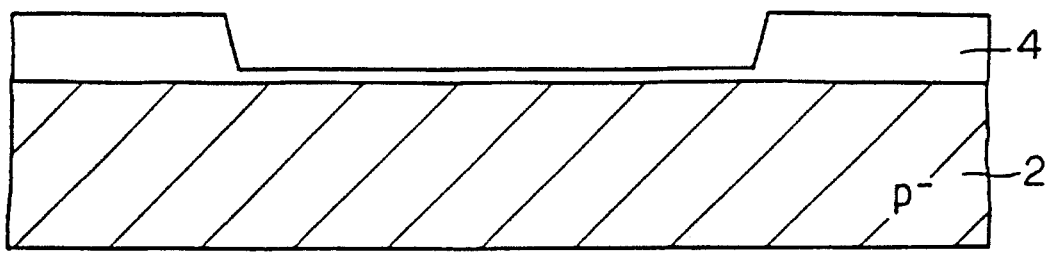
FIGS. 3 to 10 are cross sections showing first to eighth steps of manufacturing the semiconductor device.

Referring to FIG. 3, on a surface of a $p^-$ semiconductor substrate 2 having the substrate impurity concentration of about 30 to about 100 $\Omega$cm, a thermal oxide film 4 is formed to the thickness of about 5000 Å to 10000 Å. Thereafter, a prescribed region of thermal oxide film 4 is patterned so that it has the thickness in the range of about 500 Å to about 1000 Å.

Figure 4:
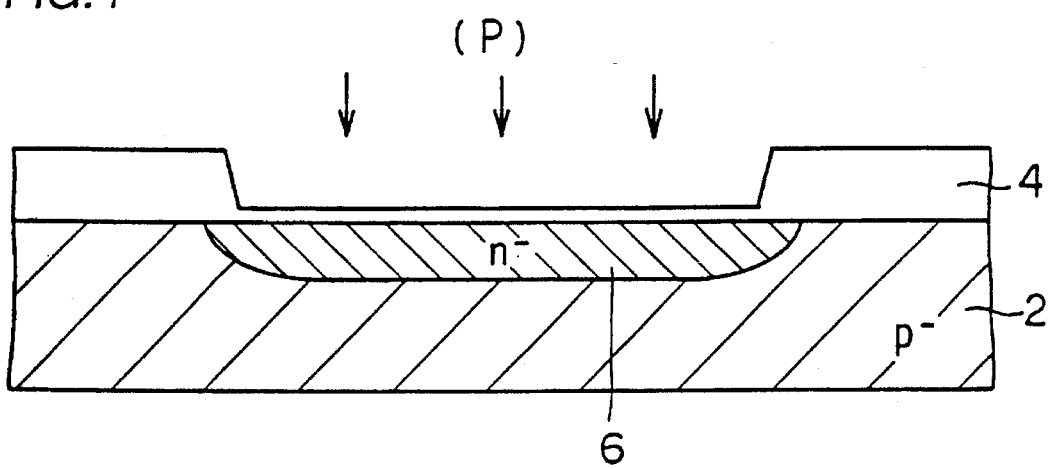

Then, referring to FIG. 4, phosphorus is introduced to the surface of semiconductor substrate 2. Then, semiconductor substrate 2 is heated to form $n^-$ buried impurity region 6. Thereafter, by thermal oxidation, thermal oxide film 4 is made thicker.

Figure 5:
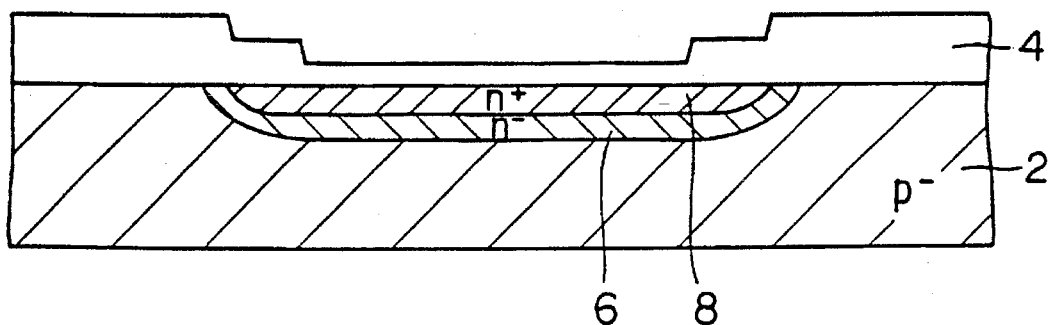

Then, referring to FIG. 5, a prescribed region of thermal oxide film 4 is etched and patterned. Thereafter, antimone is applied to that region which is enclosed by $n^-$ buried impurity region 6, heat treatment is effected to diffuse the antimone and thus $n^+$ buried impurity region 8 is formed.

Figure 6:
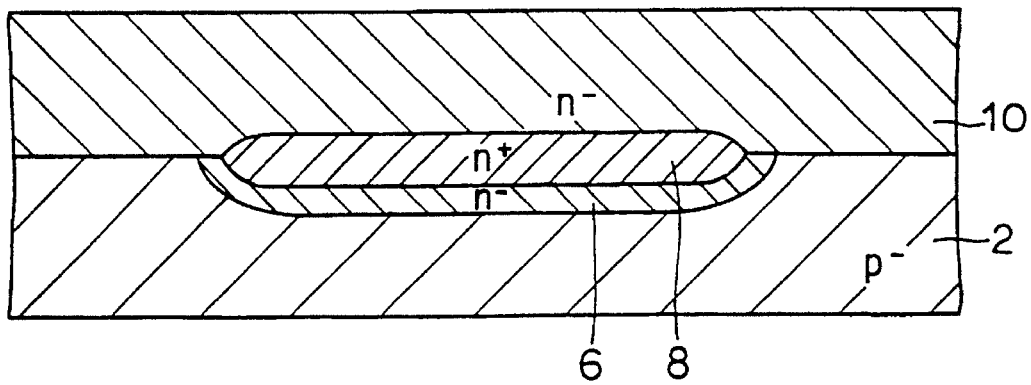
Figure 7:
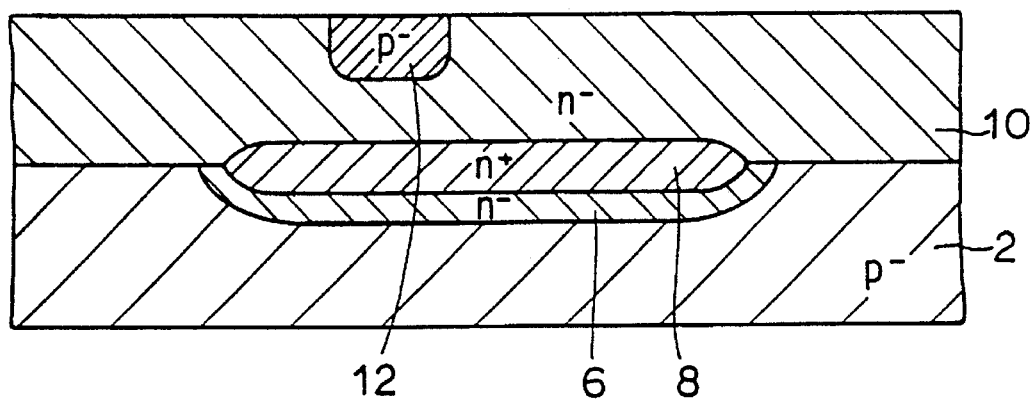

Thereafter, referring to FIG. 6, thermal oxide film 4 is removed, and $n^-$ epitaxial layer 10 is formed by epitaxial growth on the $p^-$ semiconductor substrate 2.

Thereafter, boron is introduced to a prescribed region at the surface of $n^-$ epitaxial layer 10 and annealing is effected, so as to form $p^-$ impurity region 12 for forming the n channel MOS transistor.

Figure 8:
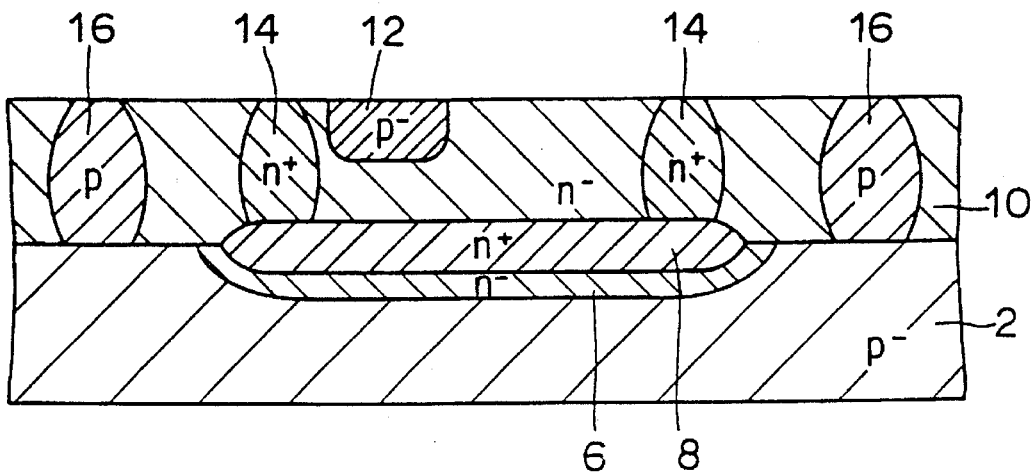

Then, referring to FIG. 8, boron is introduced to surround the prescribed region of $n^-$ epitaxial layer 10, and annealing is effected so as to form a p type isolating region 16.

Thereafter, phosphorus is introduced to a prescribed region in $n^-$ epitaxial layer 10 above $n^+$ buried impurity region 8, so as to form $n^+$ collector wall 14.

Figure 9:
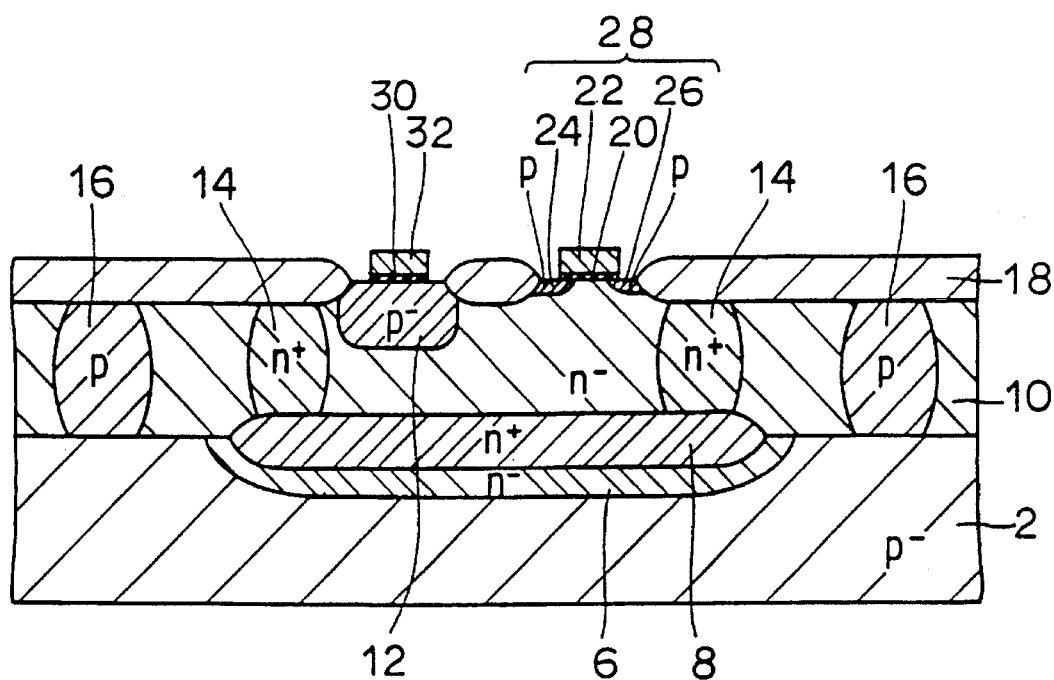

Referring to FIG. 9, by selective oxidation, a field oxide film 18 is formed on the surface of $n^-$ epitaxial layer. Thereafter, on the active regions isolated by the field oxide film 18, gate electrodes 22 and 32 are formed with gate oxide films 20 and 30 interposed therebetween.

Thereafter, by using gate electrode 22 as a mask, boron is introduced to the surface of $n^-$ epitaxial layer 10 and annealing is effected, so as to form n type source/drain regions 24 and 26 of the n channel MOS transistor.

Figure 10:
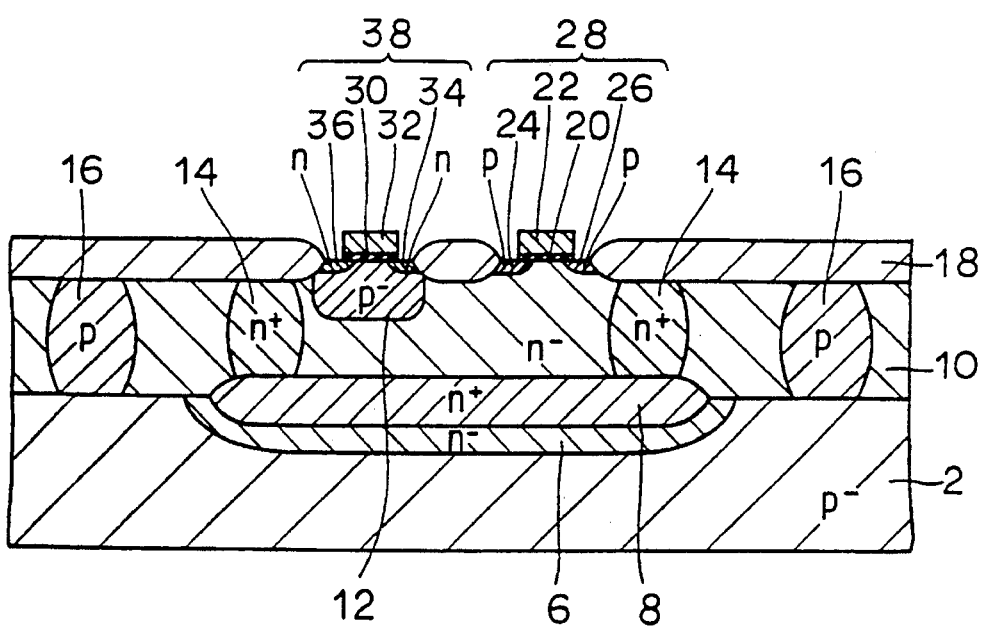

Then, referring to FIG. 10, by using gate electrode 32 as a mask, phosphorus is introduced to the surface of $n^-$ epitaxial layer 10 and annealing is effected, so as to form p type source/drain regions 34 and 36 of p channel MOS transistor.

Through the above described steps, the semiconductor device having $n^-$ buried impurity region 6 as shown in FIG. 1 is completed.

As described above, according to the first embodiment of the present invention, since there is formed the $n^-$ buried impurity region 6, the impurity concentration gradient at the pn junction can be made moderate. Consequently, the concentration of electric field in the semiconductor device can be relaxed, enabling higher breakdown voltage.

A second embodiment of the semiconductor device in accordance with the present invention and the method of manufacturing the same will be described with reference to the figures.

First, referring to FIG. 11, the structure of the semiconductor device in accordance with the present embodiment will be described.

An n⁻ epitaxial layer 10 is formed on the main surface of a p⁻ semiconductor substrate 2. At a prescribed region on the main surface of p⁻ semiconductor substrate 2, an n⁺ buried impurity region 8 is formed sandwiched by n⁻ epitaxial layer 10 and p⁻ semiconductor substrate 2. Furthermore, an n⁻ buried impurity region 6 is provided in p⁻ semiconductor substrate 2 so as to cover n⁺ buried impurity region 8.

At the surface of n⁻ epitaxial layer 10 above n⁺ buried impurity region 8, a CMOS transistor is formed.

The CMOS transistor includes a p channel MOS transistor 28 and an n channel MOS transistor 38.

The p channel MOS transistor 28 includes a gate electrode 22 formed on the surface of n⁻ epitaxial layer 10 with a gate insulating film 20 posed therebetween, and source/drain regions 24, 26 of p type impurity regions formed at position sandwiching, from left and right, the gate electrode 22.

The n channel MOS transistor 38 includes a gate electrode 32 formed on the surface of n⁻ epitaxial layer 10 with a gate insulating film 30 posed therebetween, and source/drain regions 34, 36 of n type impurity regions formed at positions sandwiching, from left and right, the gate electrode 32 in a p⁻ impurity region 12 formed in n⁻ epitaxial layer 10.

At the surface of n⁻ epitaxial layer 10, the CMOS transistor is surrounded by an element isolating oxide film 18. In n⁻ epitaxial layer 10, an n⁺ collector wall 14 is formed to surround the CMOS transistor, and a p type isolating region 16 is formed to surround collector wall 14.

Figure 12:
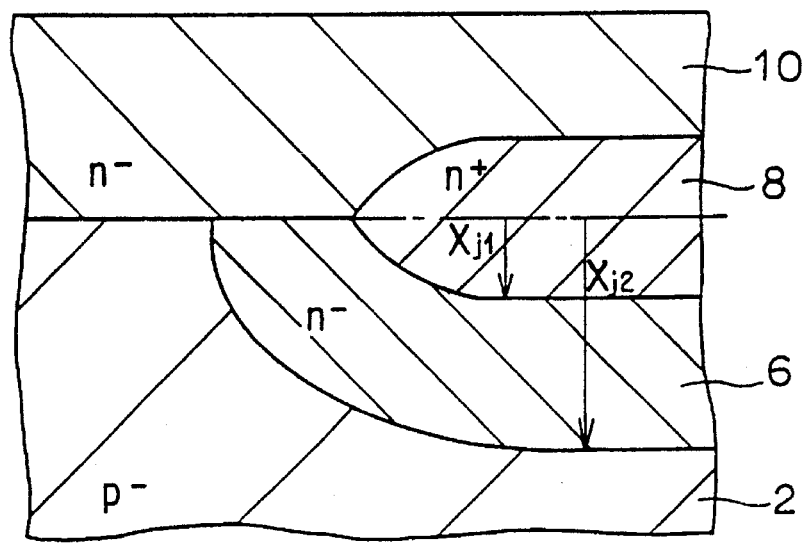
FIG. 12 is a partial cross section of the semiconductor device in accordance with the second embodiment of the present invention.

Referring to FIG. 12, the relation between n⁺ buried impurity region 8 and n⁻ buried impurity region 6 will be described.

In the present embodiment, the depth of diffusion $X_{j2}$ of n⁻ buried impurity region 8 and the depth of diffusion $X_{j1}$ of n⁻ buried impurity region 8 are set to $X_{j1}=5\mu$ and $X_{j2}=15\text{-}20\mu$, so that $X_{j2}$ is at least three times the depth $X_{j1}$.

The profile of the impurity concentration in the depth direction of t⁻ semiconductor substrate 2 of n⁺ buried impurity region and n⁻ buried impurity region 6 will be described.

Figure 13:
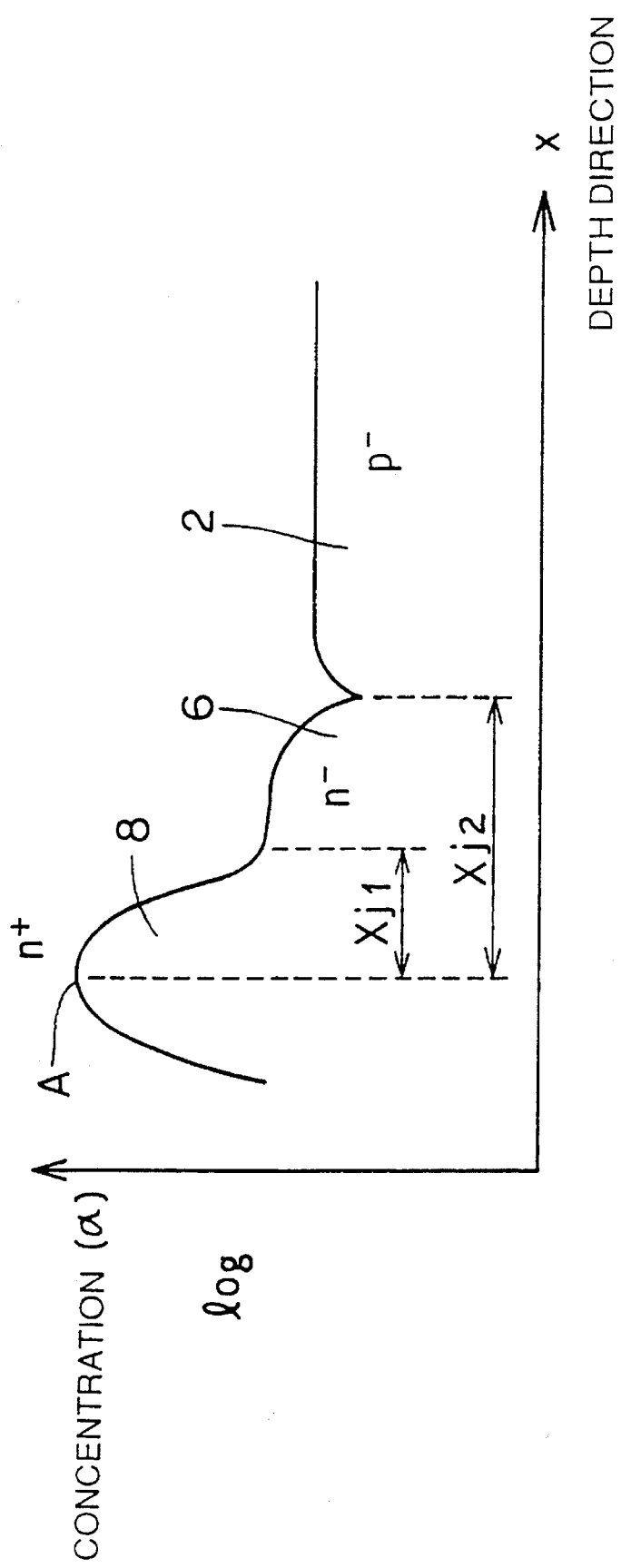
FIG. 13 is a first graph showing the profile of the impurity concentration.

Referring to FIG. 13, the depth of $X_{j1}$ of n⁺ buried impurity region 8 is the distance between a point (A) where the concentration of n⁺ assumes the maximum value to a point at which the quadratic differential of the impurity concentration assumes a positive maximum value (which is plotted as a downward convex), in accordance with the log scale.

More specifically, the depth $X_{j1}$ corresponds to the value x which provides the maximum value of $$\left\{ \frac{\alpha^2}{\alpha x^2} \log(C(x)) \right\}.$$

As for the depth $X_{j2}$ of n⁻ impurity region, similarly to $X_{j1}$ it corresponds to the distance from a point (A) at which the impurity assumes the maximum concentration to a point (the position of the pn junction) at which the concentration assumes the minimum value, in accordance with the log scale.

Referring to FIG. 13, the n⁻ buried impurity region 8 has an approximately rectangular planar pattern, and as for the radius of each of the corners thereof, it is in the range of $r_2=45$ to $65\mu$ so that it is at least three times the depth of diffusion $X_{j2}$ of n⁻ buried impurity region 8.

Figure 14:
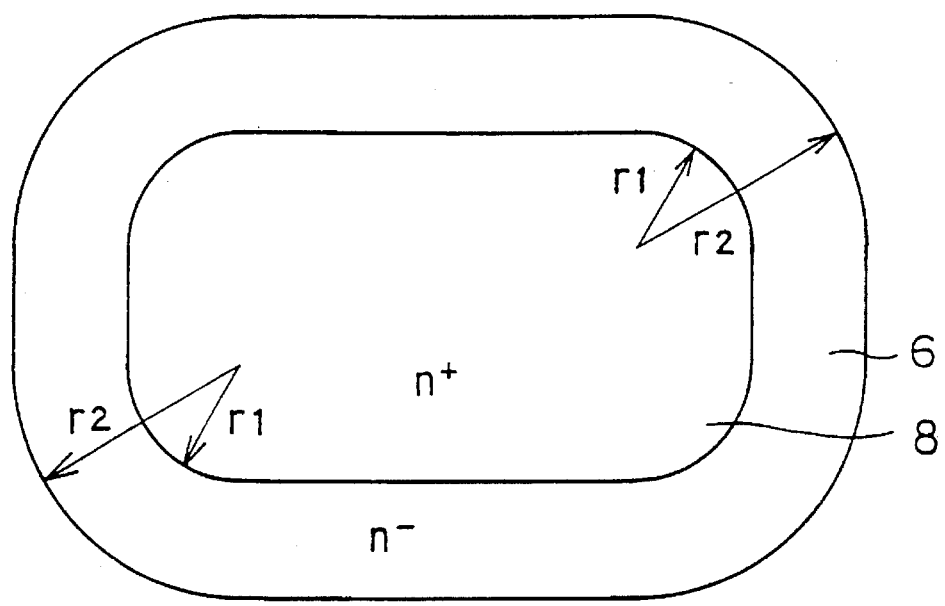
FIG. 14 is a schematic plan view of the semiconductor device in accordance with the second embodiment of the present invention.

Referring to FIG. 14, n⁺ impurity region 6 has approximately rectangular planar pattern, and as for the radius of each of the corners thereof, it is about $r_1 \approx 15\mu$, so that it is at least three times the depth of diffusion $X_{j1}$ of n⁺ buried impurity region 8.

The profile of the impurity concentration in the direction along the surface of p⁻ semiconductor substrate 2 of n⁺ buried impurity region 8 and n⁻ buried impurity region 6 will be described.

Figure 15:
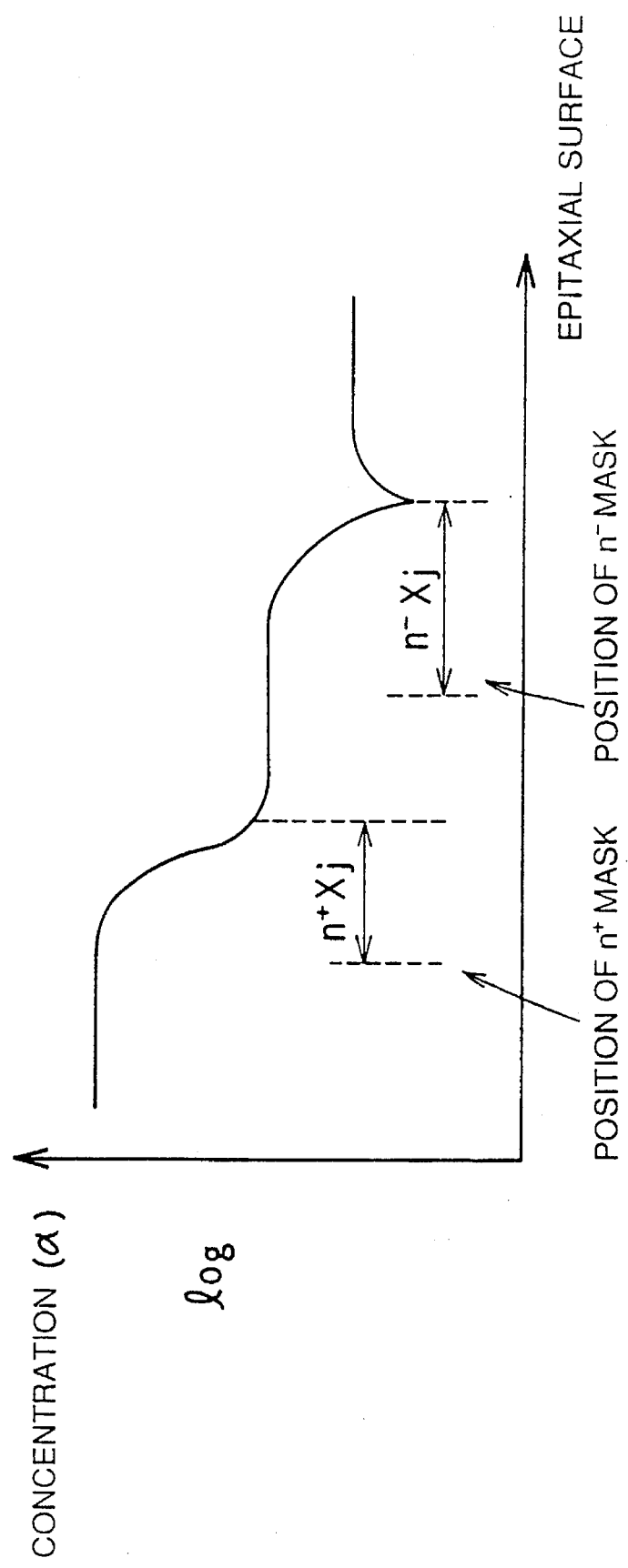
FIG. 15 is a second graph showing the profile of the impurity concentration.

Referring to FIG. 15, the length of diffusion $(X_j)$ in the depth direction of p⁻ semiconductor substrate 2 can be considered equal to the length of diffusion in the direction along the surface of p⁻ semiconductor substrate 2 at the time of diffusion of impurity for n⁺ buried impurity region 8 and n⁻ buried impurity region 6.

Therefore, the positions of the mask patterns for n⁺ buried impurity region 8 and n⁻ buried impurity region 6 can be determined in the following manner.

First, the position of the mask pattern for forming n⁺ buried impurity region 8 should be a position displaced by $X_{j1}$ from the position at which the value of quadratic differential of the impurity concentration assumes a positive maximum value in accordance with the log scale.

As for the position of the mask pattern for forming n⁻ buried impurity region 6, it should be positioned at a point displaced by a $X_{j2}$ from a position (the position of pn junction) at which the impurity concentration assumes the minimum value, in accordance with the log scale. More detailed description will be given with reference to FIGS. 16 to 21.

Figure 16:
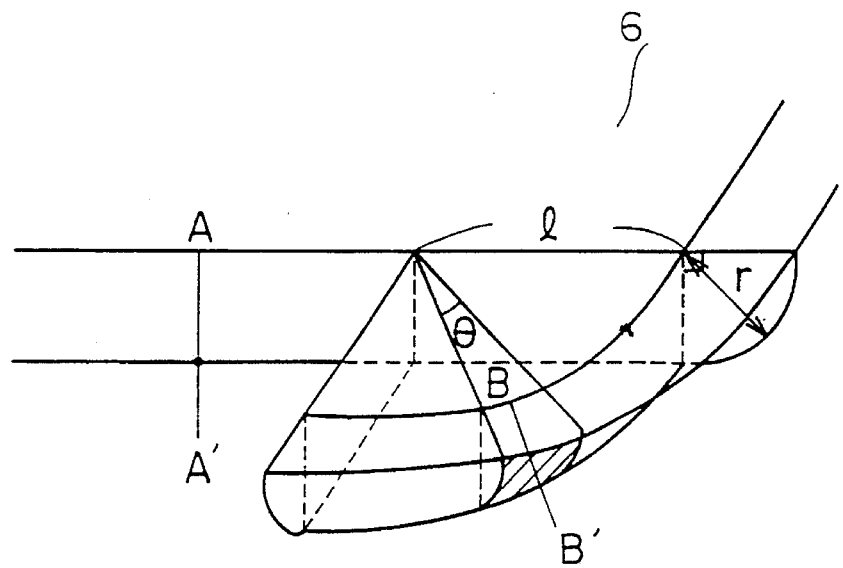
FIG. 16 is a partial perspective view of the semiconductor device in accordance with the second embodiment of the present invention.

FIG. 16 is a perspective view of n⁻ buried impurity region 6 cut at the interface between p⁻ semiconductor substrate 2 and n⁻ epitaxial layer 10. Here, n⁺ buried impurity region 8 is not shown. Here, it is assumed that impurity concentration is sufficiently lowered in p⁻ semiconductor substrate 2 in order to provide higher breakdown voltage.

Figure 17:
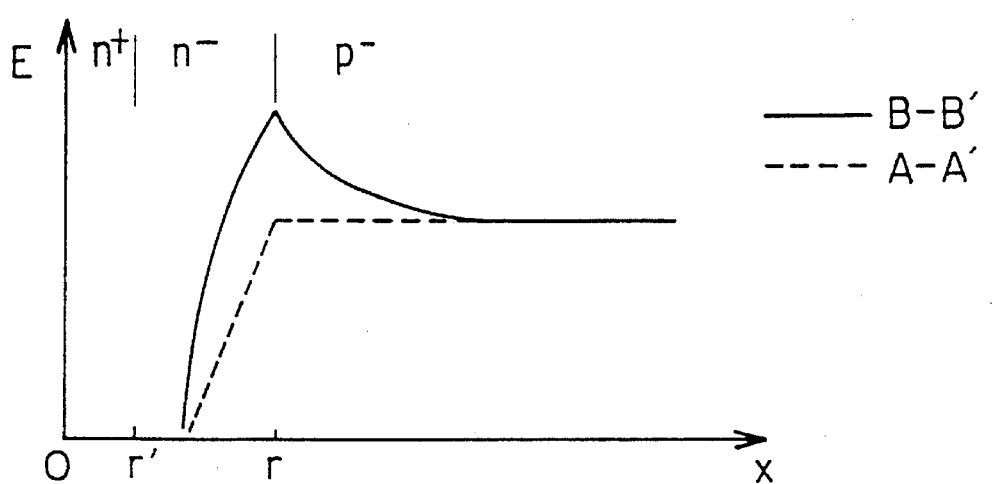
FIG. 17 is a first graph showing the state of electric field in the semiconductor device in accordance with the second embodiment of the present invention.

Referring to FIG. 17, the electric field in the direction (A–A' of FIG. 16) perpendicular to the bottom surface of n⁻ buried impurity region 6 is constant in the region of p⁻ semiconductor substrate 2 as shown by the dotted line.

Meanwhile, the electric field and the direction of the electric field at the corner (in the direction of B–B' in the figure) of n⁻ buried impurity region 6 changes in accordance with the impurity concentration of n⁻ buried impurity region 6, and when the impurity concentration of n⁻ buried impurity region 6 attains lower than a prescribed value, the peak of the electric field moves to the interface between n⁺ buried impurity region 8 and n⁻ buried impurity region 6.

In this embodiment, the peak of the electric field is generated at the pn junction, because the impurity concentration of n⁻ buried impurity region 6 is relatively high, as shown by the solid line in FIG. 16.

The electric field and the inclination of the electric field are represented, in approximation, by the following equations (1) and (2).

$$E = \frac{Q}{\left\{ \epsilon \theta \left( \frac{\pi l x}{2} + x^2 \right) \right\}} \quad (1)$$

$$(x \geq r)$$

$$\frac{dE}{dx} = \frac{-Q\left( \frac{\pi l}{2} + 2x \right)}{\left( \epsilon \theta x^2 \left( \frac{\pi l}{2} + x \right) \right)^2} \quad (2)$$

$$(x \geq r)$$

Here, it is assumed that the electric field at the pn junction interface at the corner portions of n⁻ buried impurity region 6 and n⁺ buried impurity region is constant. Q represents the total of space charges on the side of n⁻ buried impurity region 6 where electric line of force passing through the hatch region of FIG. 16 terminates, 1 represents the corner radius of n⁻ buried impurity region 6, and r represents the depth of diffusion of n⁻ buried impurity region 6.

As can be seen from equations (1) and (2), at the corner portion, the electric field changes and provides the peak of the electric field at the pn junction, and by this concentration of the electric field, the breakdown voltage of the semiconductor device as a whole is determined.

Figure 18:
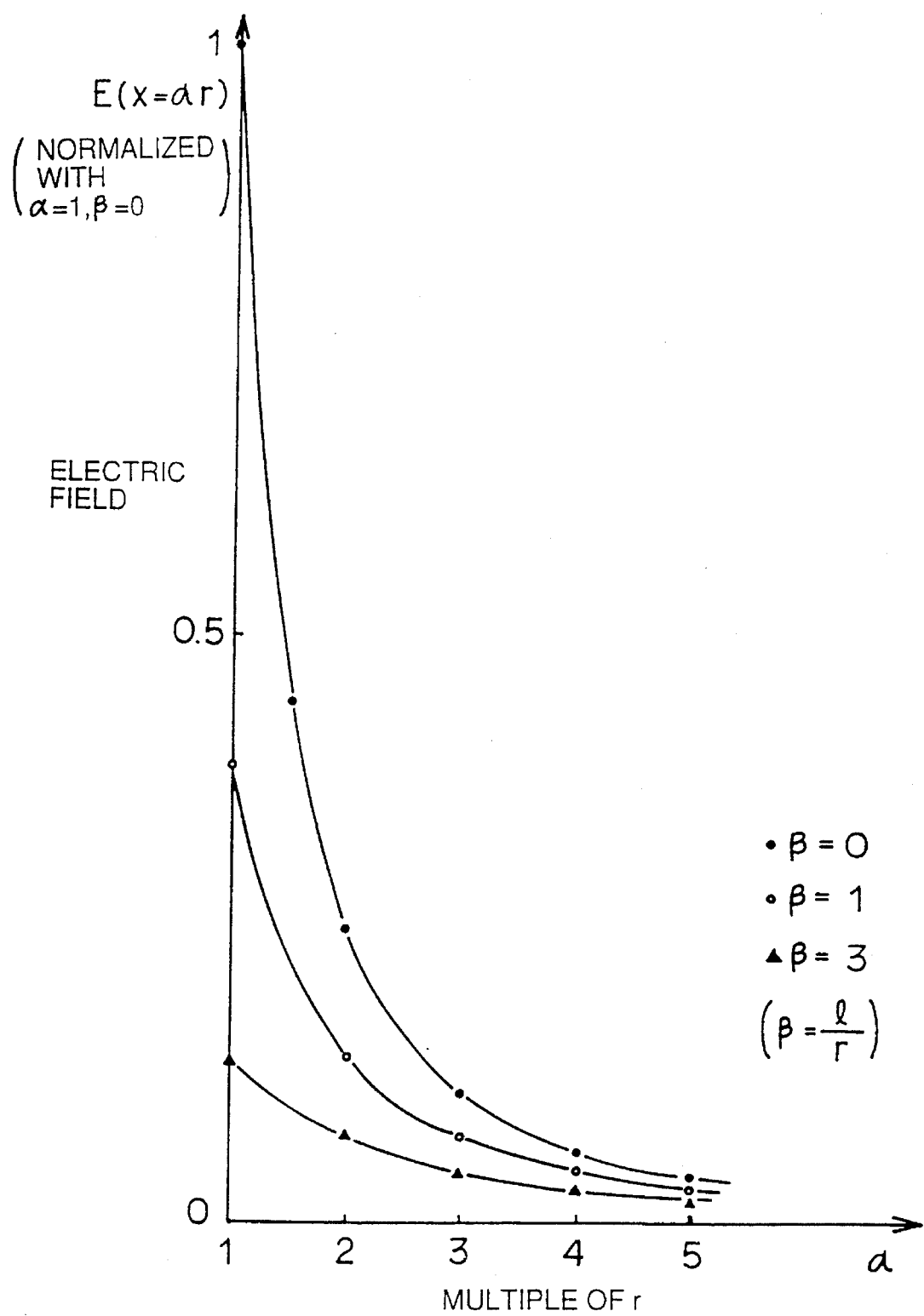
FIG. 18 is a second graph showing the state of the electric field in the semiconductor device in accordance with the second embodiment of the present invention.

The relation between the depth r of diffusion of n⁻ buried impurity region 6 and the electric field is shown in FIG. 18.

FIG. 18 shows the change of electric field E, assuming that the value of the electric field E (X=r) is is 0, with the value r is multiplied by α, when the value β, which is l/r=β is 0, 1 and 3, respectively.

The relation shown in FIG. 18 can be represented by the following equation (3), where l/r=β.

$$\frac{E(x=\alpha r)}{E(x=r, \beta=0)} = \frac{1}{\frac{\pi\alpha\beta}{2} + \alpha^2} \leq \frac{1}{10} \quad (3)$$

$$\alpha \geq -\frac{\beta\pi}{4} + \left(\frac{\beta^2\pi}{16} + 10\right)^{1/2}$$

When l=0 (β=0), the equation (3) is satisfied when α is at least about 3. If l>0 (β>0), the value of α can be further reduced.

Therefore, the effect of introduction of n⁻ buried impurity region 6 can be surely obtained when r is set to at least three times the depth of diffusion of n⁺ buried impurity region 8.

Figure 19:
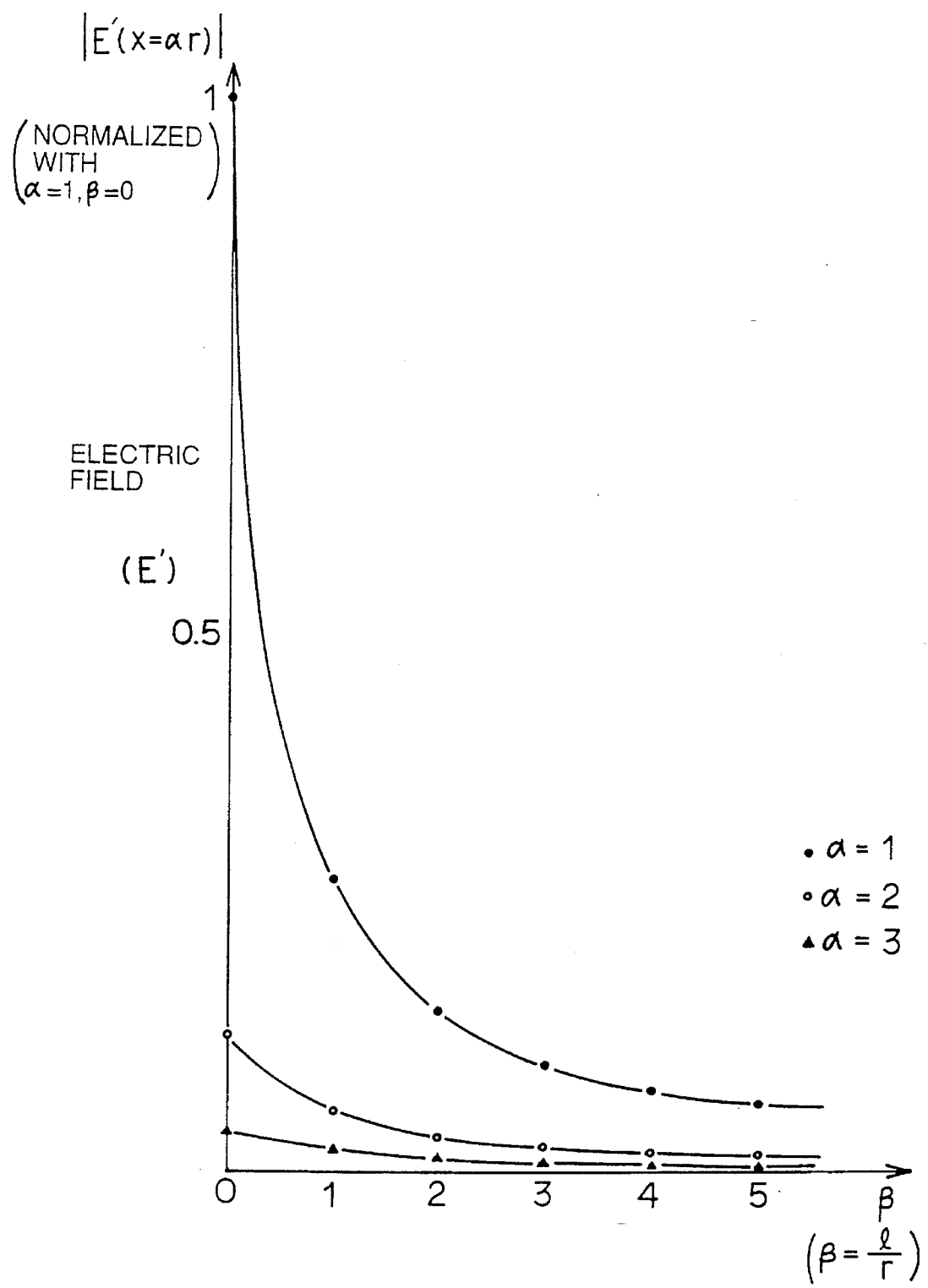
FIG. 19 is a third graph showing the state of the electric field in the semiconductor device in accordance with a third embodiment of the present invention.

The change of |E' (X=αr)| with respect to β is shown in FIG. 19. Referring to FIG. 19, a case where α=1 and β=0 (corresponds to the case when the corner of the pattern has a right angle) is assumed to be 1 for normalization, and the value of α is set to 1, 2 and 3, respectively. It can be seen that the value E reduces significantly as the value β increases. In order to stabilize the effect of lowering the value E when β is increased to some extent from 0, the value |E' (X=αr)| should be 1/10 at the most, when β=0.

The above condition can be represented by the equation (4) below.

$$\frac{\left\{\frac{\pi\beta}{4} + \alpha\right\}}{\left\{\alpha^2\left(\frac{\pi\beta}{2} + \alpha\right)^2\right\}} \quad (4)$$

The above requirement can be satisfied if β is β≧3 when α=1.

When α>1, the value of β can be further reduced.

Therefore, in order to meet the above requirement, β should be at least 3.

As described above, by setting the values r and l appropriately, the breakdown voltage of the semiconductor device can be increased. Further, by providing n⁻ buried impurity region 6 only at those portions which require higher breakdown voltage, the structure does not prevent miniaturization of the semiconductor device.

Figure 20:
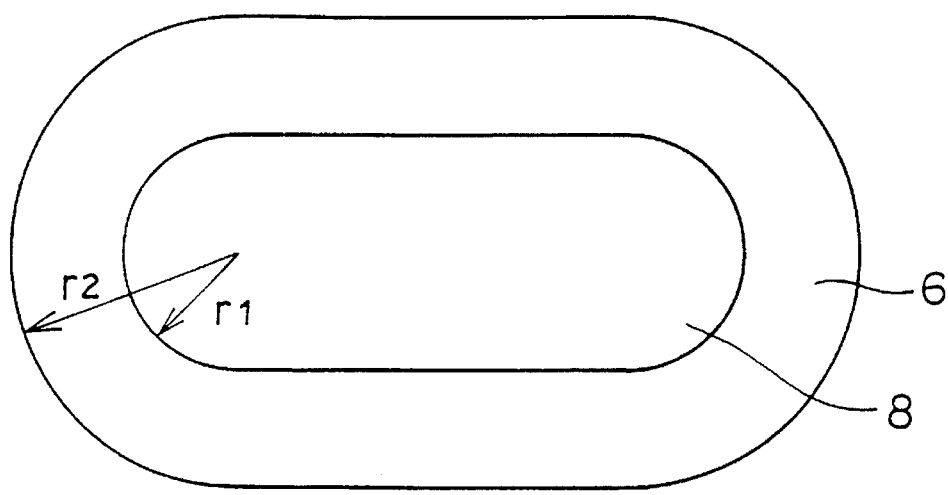
FIGS. 20 to 22 are first to third plan views showing other acceptable shapes of the planar pattern of the buried impurity region.
Figure 21:
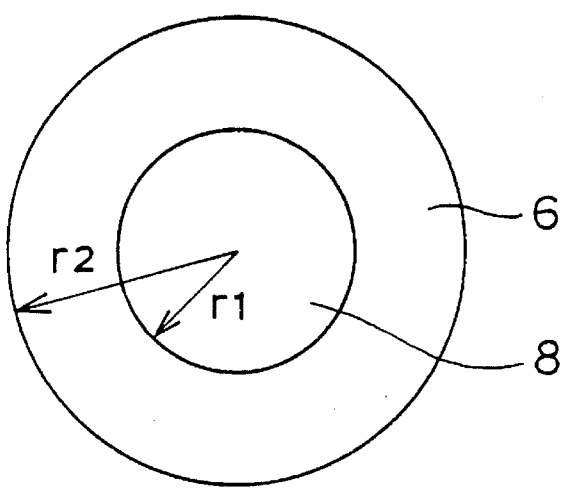
Figure 22:
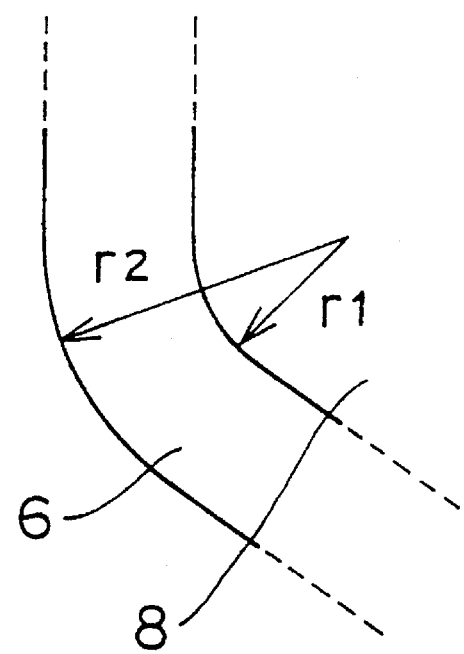

Though the n⁻ buried impurity region 8 and n⁺ buried impurity region 6 have approximately rectangular planar pattern such as shown in FIG. 14, the planar pattern is not limited thereto. The impurity regions may have an oval planar pattern as shown in FIG. 20, a circular pattern as shown in FIG. 21 or any other polygonal shapes provided that the relation between r1 and r2 at the corner of the polygon, as shown in FIG. 22, satisfy the above-described relation.

The method of manufacturing the semiconductor device shown in FIG. 11 will be described with reference to FIGS. 23 to 34. FIGS. 23 to 34 are cross sections showing the steps of manufacturing the semiconductor device shown in FIG. 11.

Figure 23:
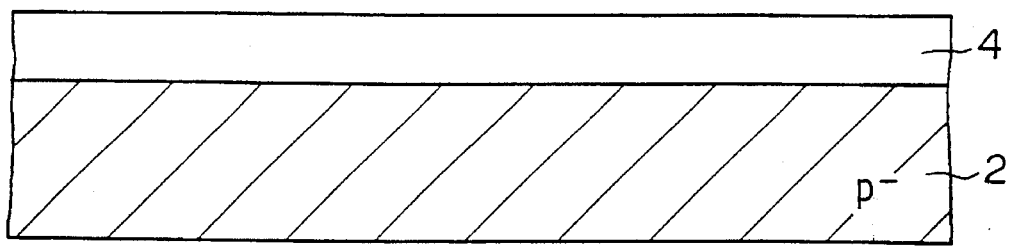
FIGS. 23 to 34 are cross sections showing first to twelfth steps of manufacturing the semiconductor device in accordance with the present invention.
Figure 24:
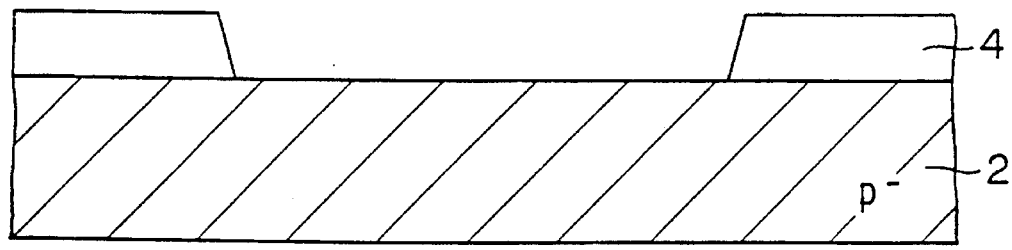
Figure 25:
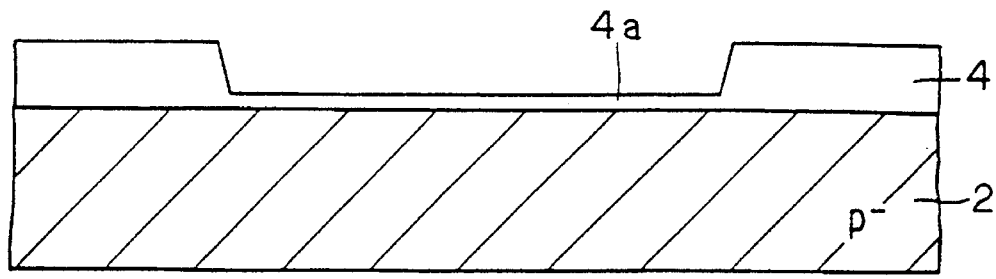

First, referring to FIG. 23, on a surface of p⁻ semiconductor substrate 2 having the substrate impurity concentration of about 30 to about 100 Ωcm, a thermal oxide film 4 is formed to the thickness of about 5000 Å to about 10000 Å. Thereafter, referring to FIG. 24, a prescribed region of thermal oxide film 4 is removed by etching. Then, referring to FIG. 25, on p⁻ semiconductor substrate 2, a thermal oxide film 4a having the thickness of about 500 to about 1000 Å is formed.

Figure 26:
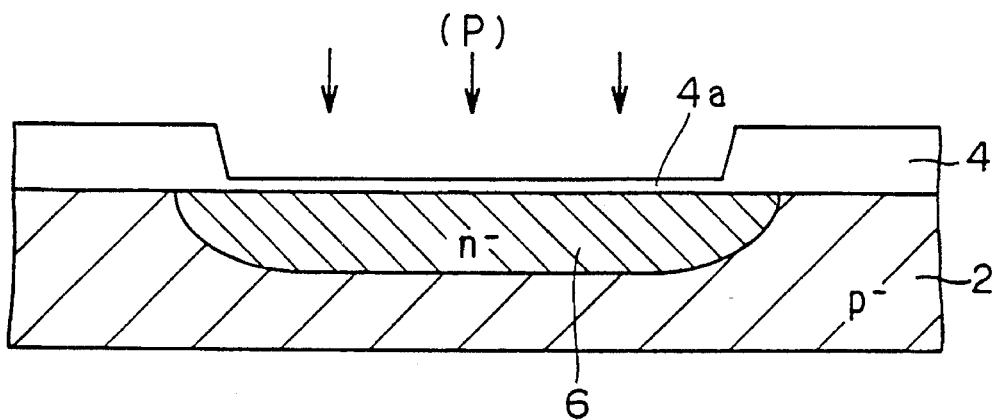

Referring to FIG. 26, phosphorus is introduced with the implantation energy of about 120 kV and the dosage of 1×10¹² to 1×10¹³ to the surface of semiconductor substrate 2.

Thereafter, annealing is effected for about 30 hours at about 1260° C. on p⁻ semiconductor substrate 2, and thus an n⁻ buried impurity region 6 is formed.

Figure 27:
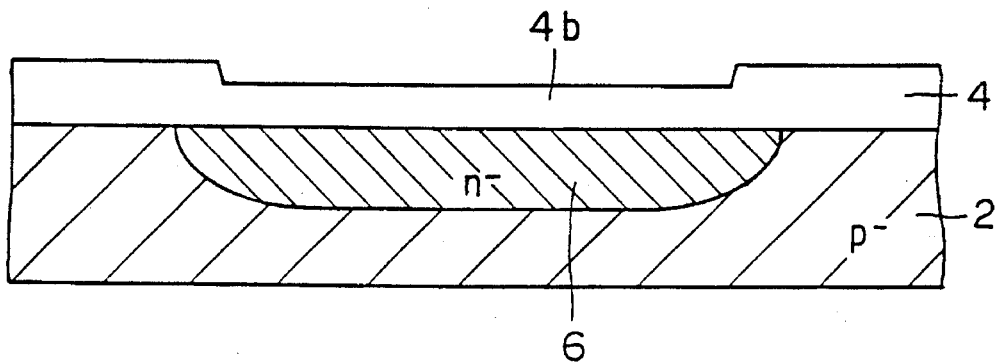
Figure 28:
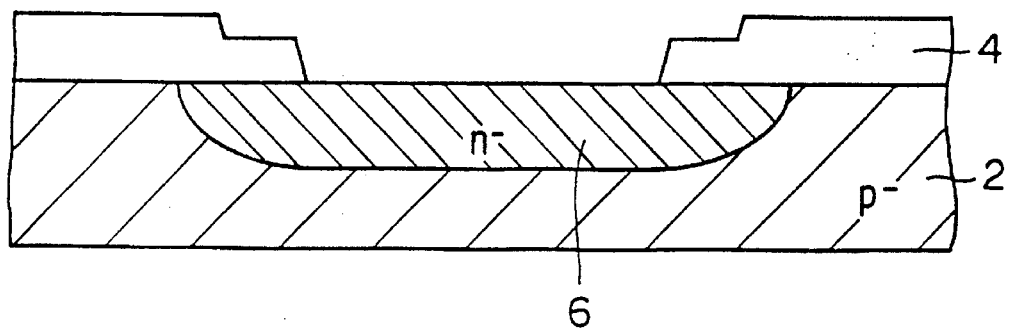

Thereafter, referring to FIG. 27, on the surface of p⁻ semiconductor substrate 2, thermal oxide film 4b is formed by thermal oxidation to the thickness of about 5000 Å to about 10000 Å. Then, referring to FIG. 28, a prescribed region of thermal oxide film 4 is etched to expose the surface of p⁻ semiconductor substrate 2.

Thereafter, antimone is applied, or phosphorus, arsenic or the like is implanted, to that region which is enclosed by n⁻ buried impurity region 6, annealing is carried out for about 3 hours at about 1240° C. so as to diffuse impurities and thus n⁺ buried impurity region 8 is formed.

Thereafter, thermal oxide film 4 is removed, and an n⁻ epitaxial layer 10 is formed on p⁻ semiconductor substrate 2 by epitaxial growth. Consequently, the depth of diffusion X_{j1} of n⁺ buried impurity region 8 attains X_{j1}≈5µ and it is possible to set the depth of diffusion X_{j2} of n⁻ buried impurity region 6 to X_{j2}≈15 to 20µ.

Figure 31:
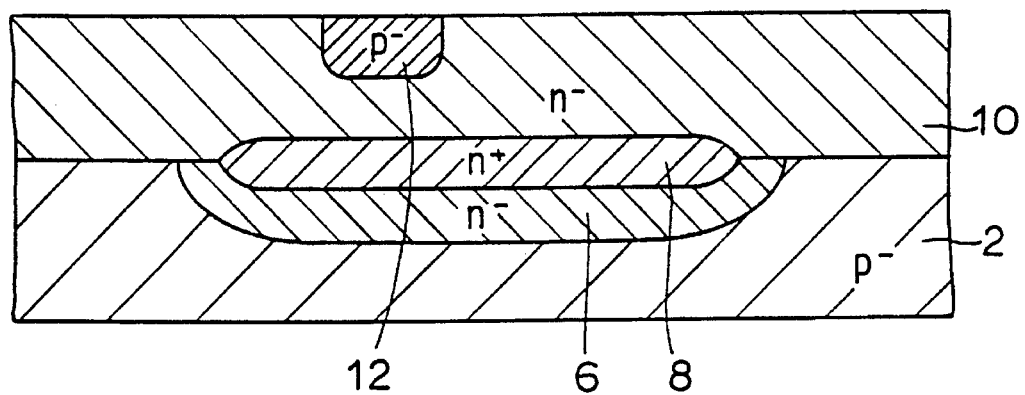

Referring to FIG. 31, boron is introduced to a prescribed region at the surface of n⁻ epitaxial layer 10, annealing is carried out, and thus p⁻ impurity region 12 for forming the n channel MOS transistor is formed.

Figure 32:
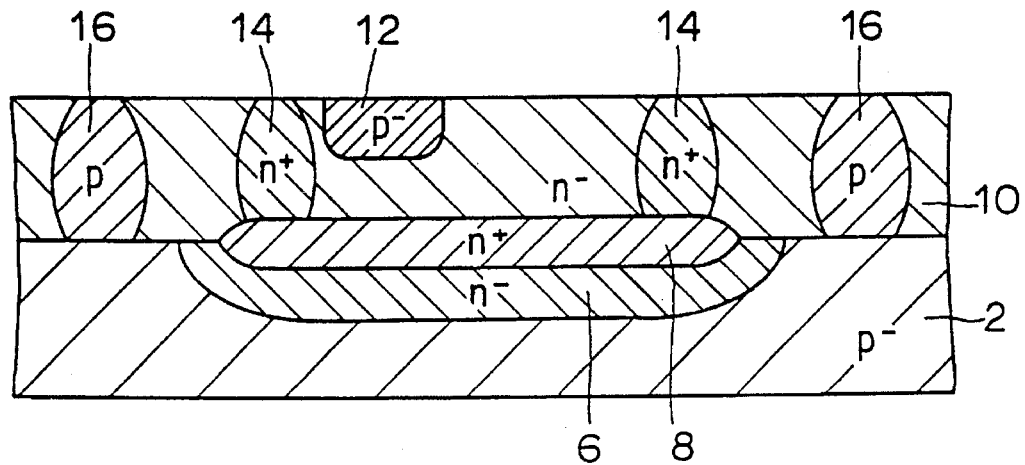

Referring to FIG. 32, boron is introduced to surround a prescribed region in n⁻ epitaxial layer 10 and annealing is effected, so as to form the p type isolating region 16.

Thereafter, phosphorus is introduced in a prescribed region of n⁻ epitaxial layer 10 above the n⁺ buried impurity region and annealing is effected, and thus n⁺ collector wall 14 is provided.

Figure 33:
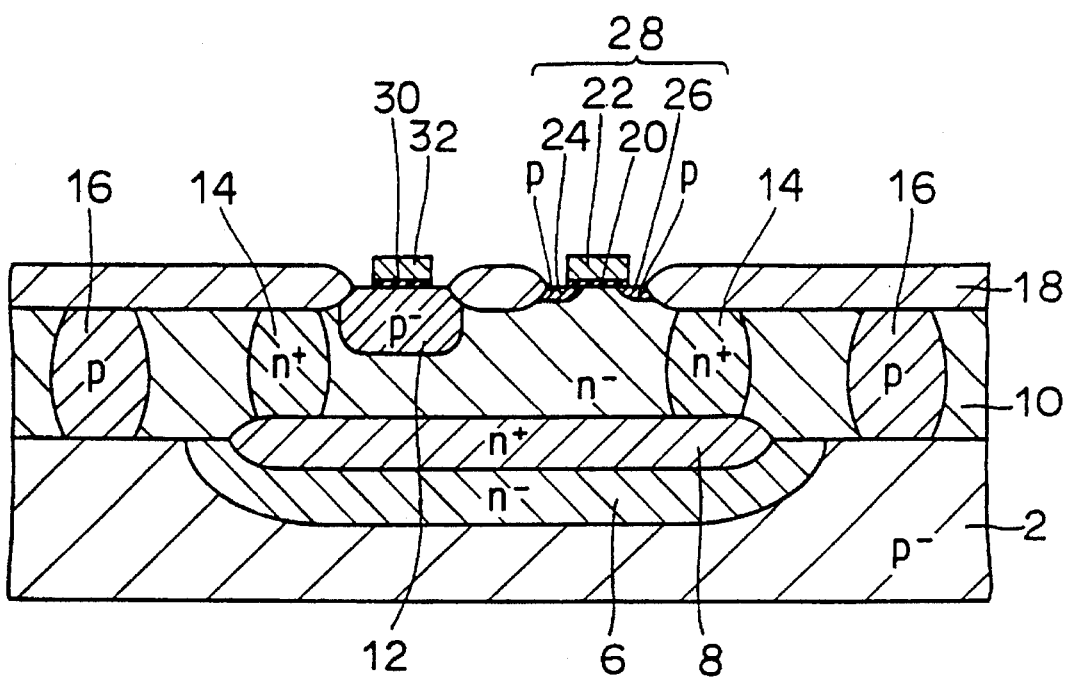

Then, referring to FIG. 33, a field oxide film 18 is formed at the surface of n⁻ epitaxial layer 10 by selective oxidation. Thereafter, in the active region isolated by the field oxide film 18, gate electrodes 22 and 32 are formed with gate oxide films 20 and 30 posed therebetween.

Thereafter, by using gate electrode 22 as a mask, boron is introduced to the surface of n⁻ epitaxial layer 10 and annealing is effected, so that p type source/drain regions 24, 26 of the n channel MOS transistor are formed.

Figure 34:
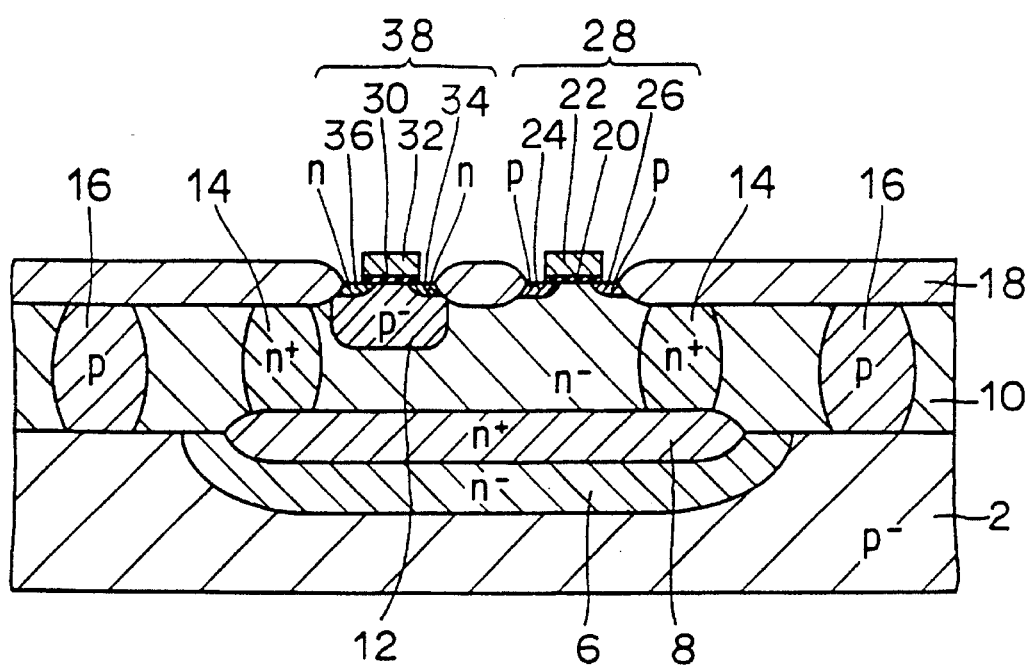

Referring to FIG. 34, phosphorus is introduced to the surface of n⁻ epitaxial layer by using gate electrode 32 as a mask, annealing is effected, and thus n type source/drain regions 34 and 36 of the p channel MOS transistor are formed.

Figure 11:
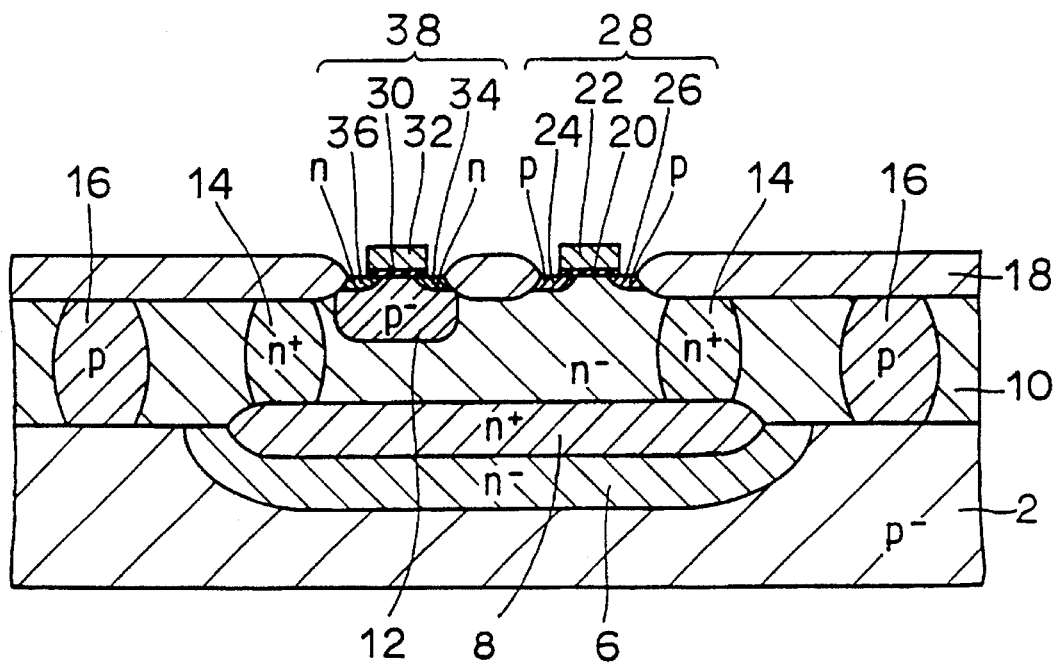
FIG. 11 is a cross section showing a structure of a semiconductor device in accordance with a second embodiment of the present invention.

Through the above described steps, the semiconductor device shown in FIG. 11 is completed.

According to this second embodiment, the depth of diffusion of n⁻ buried impurity region is made three times the depth of diffusion of n⁺ buried impurity region, and the radius at the corner of n⁻ buried impurity region is made at least three times the radius of the corner of n⁺ buried impurity region.

Consequently, minimum dimension necessary for suppressing the electric field can be set, and thus breakdown voltage of the semiconductor device can be increased while not preventing miniaturization of the device.

A third embodiment of the present invention will be described in the following. The structure of the third embodiment is the same as the second embodiment in its structure. However, the impurity concentration of n⁻ buried impurity region 6 is relatively low, and therefore the peak electric field is at the interface between n⁺ buried impurity region 8 and n⁻ buried impurity region 6.

Figure 35:
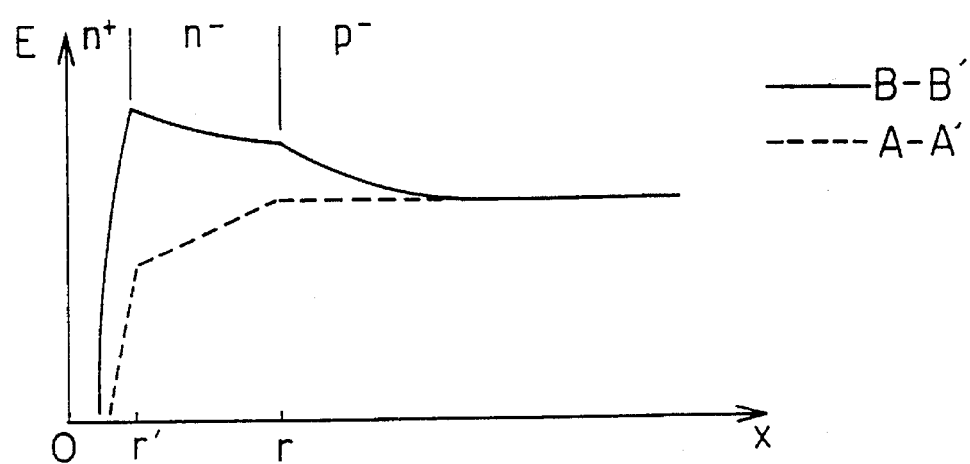
FIG. 35 is a first graph showing the state of the electric field in the semiconductor device in accordance with the third embodiment of the present invention.

FIG. 35 is a graph corresponding to FIG. 17 of the embodiment 2.

As compared with FIG. 15, assuming that the spatial charges of n⁻ buried impurity region 6 is sufficiently smaller than Q of the second embodiment, the electric field at B–B' and the inclination of the electric field can be represented by the equations (5) and (6). The values of r' and l' are the same as r and l of Embodiment 2.

Since the equations representing the electric field and the inclination of the electric field are the same as those of the prior art, seemingly there is no advantage of higher breakdown voltage. However, since spatial charges in the n⁻ buried impurity region 6 serve to suppress the peak of the electric field, the same effect as in the second embodiment can be obtained.

Figure 36:
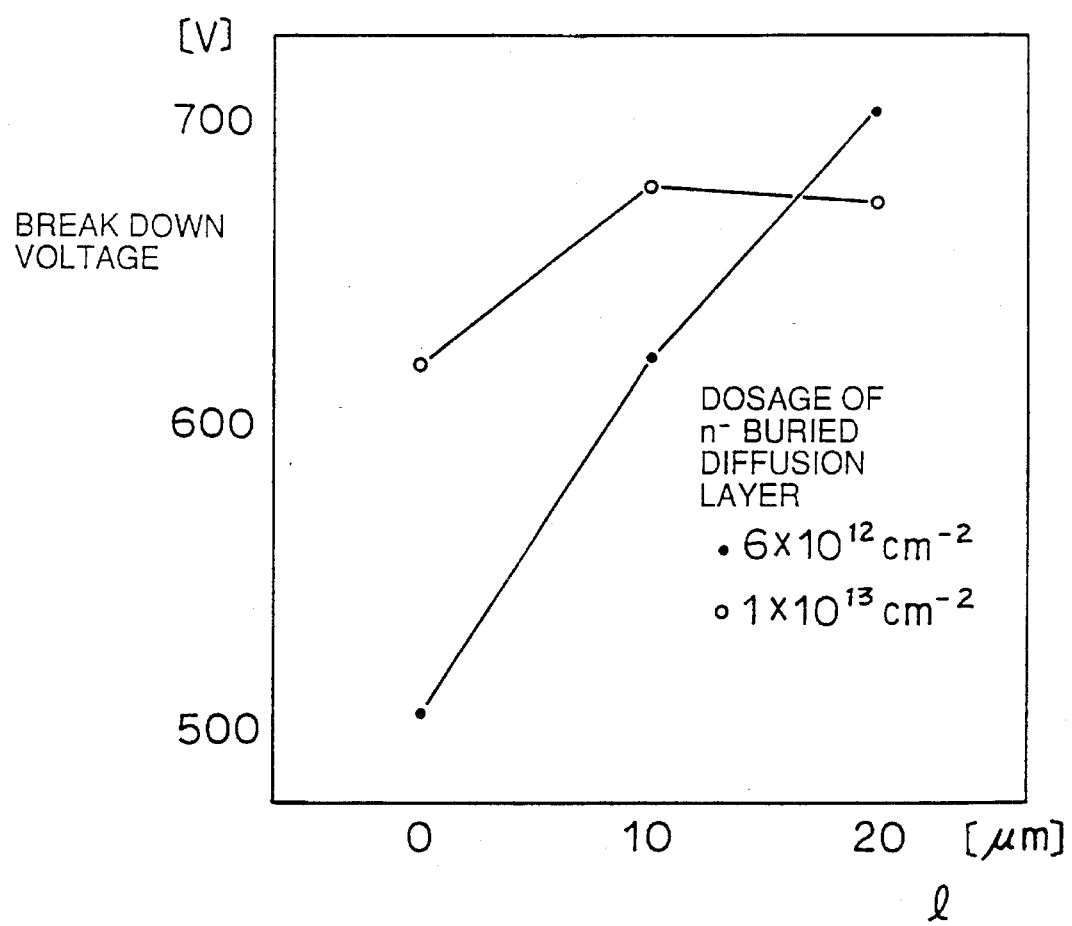
FIG. 36 is a graph showing the relation between the breakdown voltage and the dosage in the n⁻ buried impurity region of the semiconductor device in accordance with third embodiment of the present invention.
Figure 37:
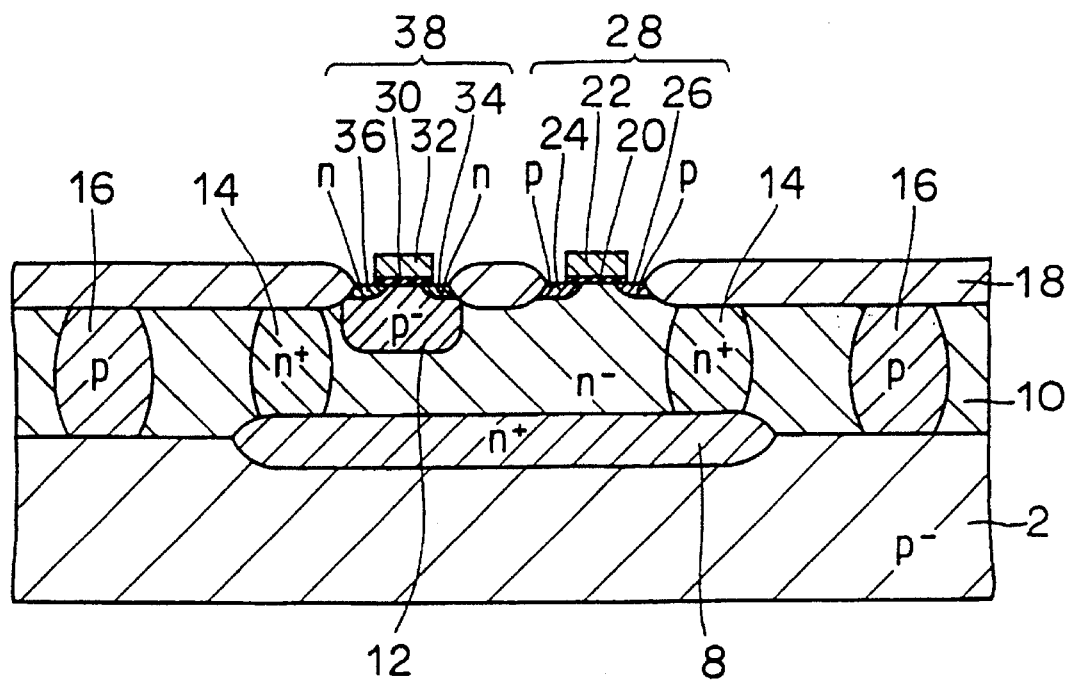
FIG. 37 is a cross section showing a structure of a conventional semiconductor device.
Figure 38:
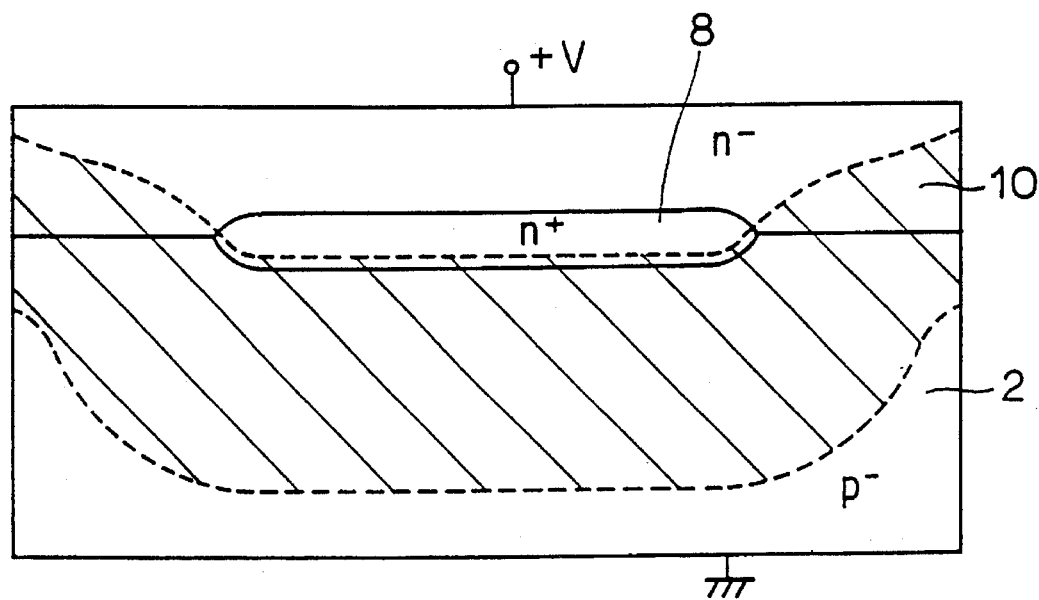
FIG. 38 is a schematic view showing the state of the depletion layer generated in the semiconductor device of the prior art.
Figure 39:
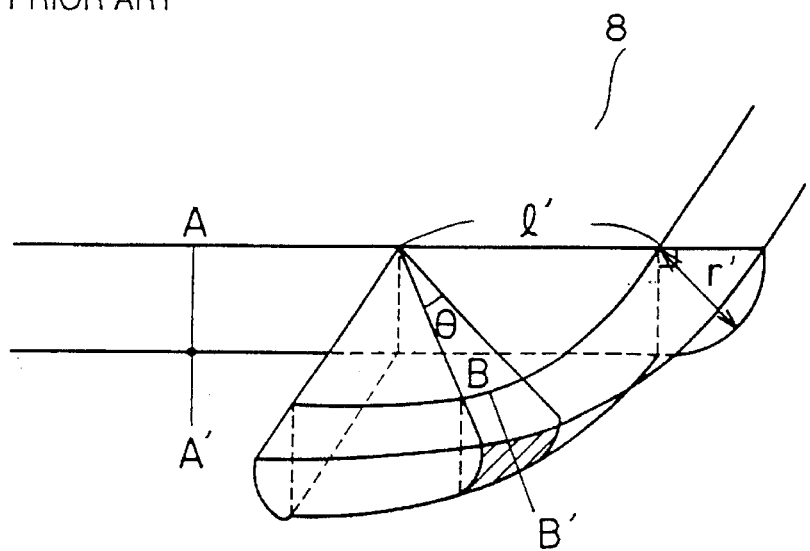
FIG. 39 is a partial perspective view showing the structure of the conventional semiconductor device.
Figure 40:
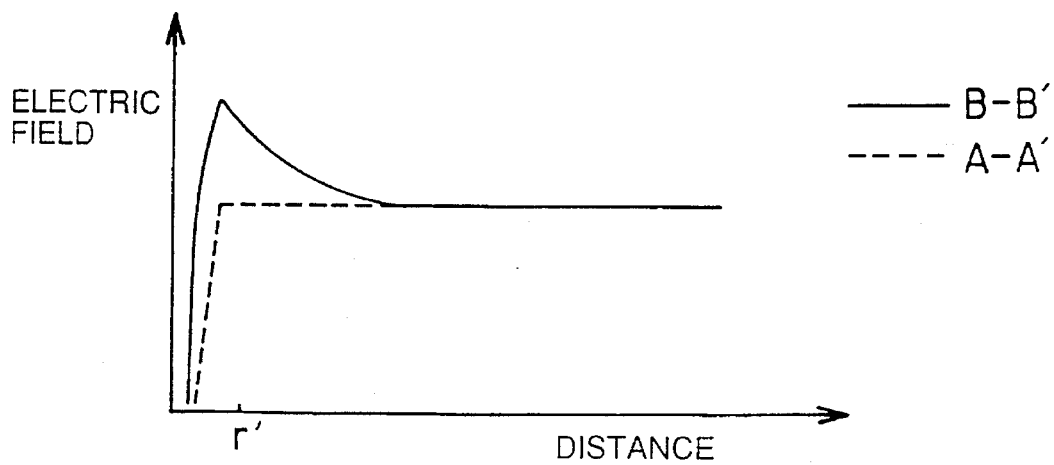
FIG. 40 is a first graph showing the state of the electric field in the conventional semiconductor device.
Figure 41:
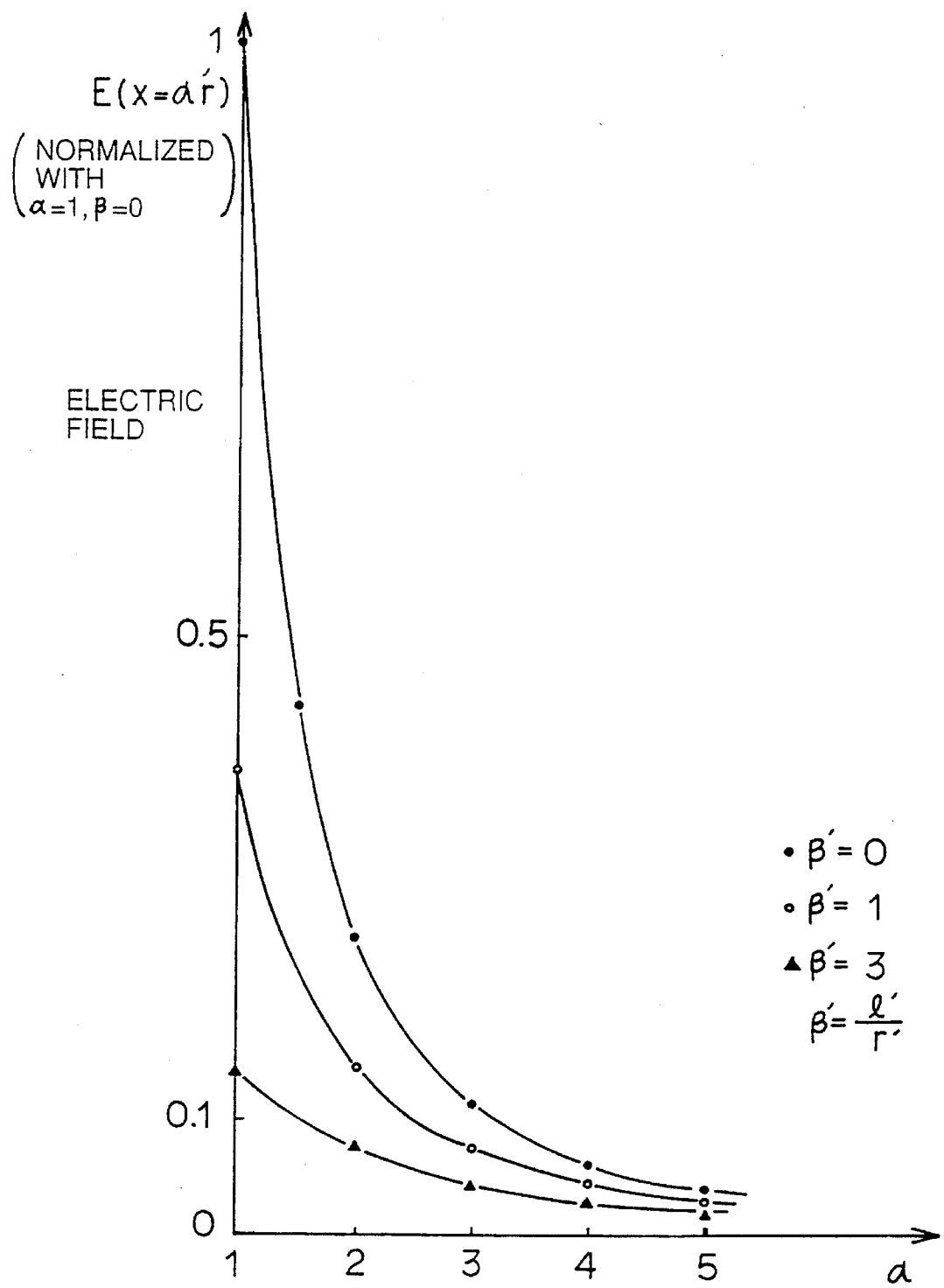
FIG. 41 is a second graph showing the state of the electric field in the conventional semiconductor device.
Figure 42:
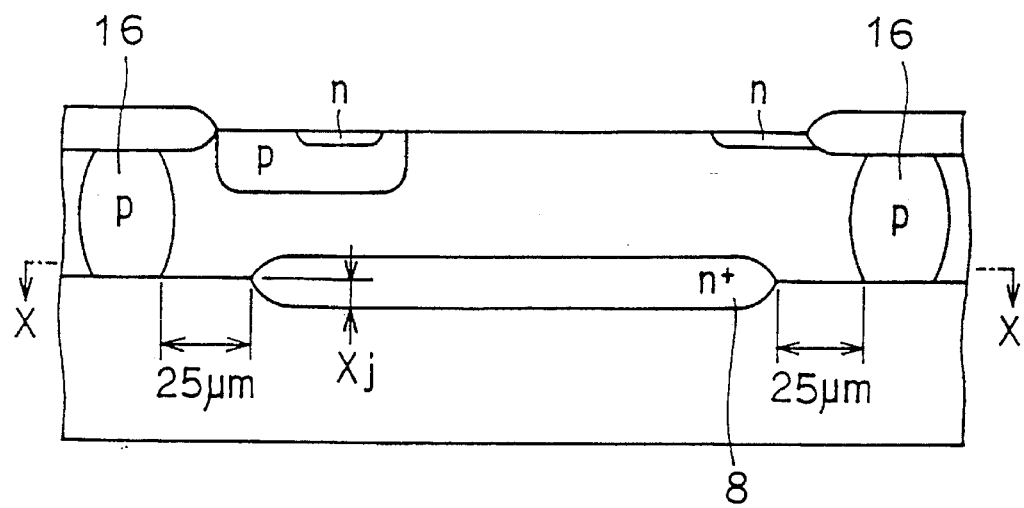
FIG. 42 shows the problems of the conventional semiconductor device.
Figure 43:
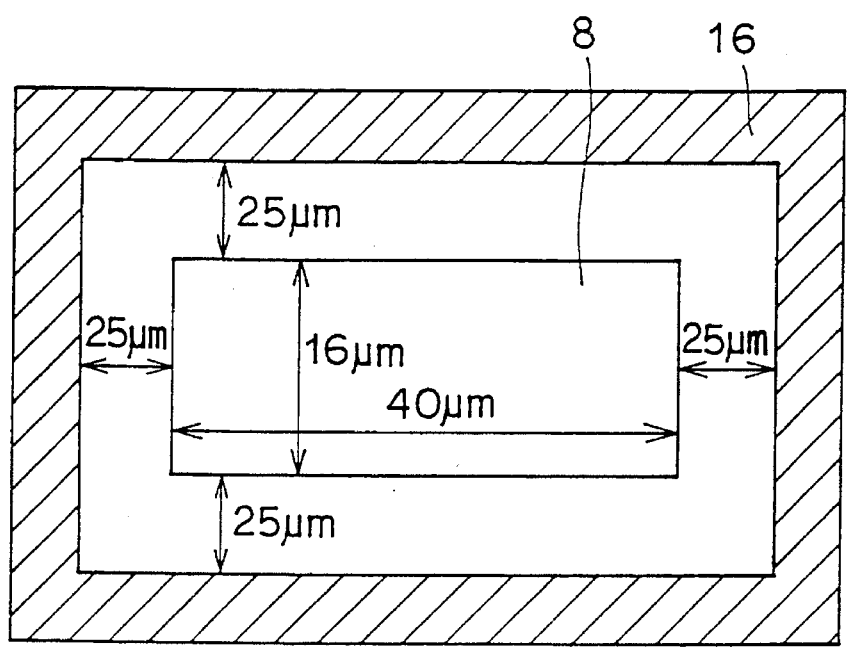
FIG. 43 is a cross section taken along the line X—X of FIG. 42.

Referring to FIGS. 36, the result of optimization of the structure of the semiconductor device will be described.

FIG. 36 shows the difference in the relation between the breakdown voltage and the value l when $r_1'=5$ μm, $l'=0$ μm and $r_2'=16$ μm with respect to the impurity concentration of n⁻ buried impurity region 6.

When the dosage of n⁻ buried impurity region 6 is $6\times10^{12}$ cm⁻², the peak of the electric field is at the pn junction between p⁻ semiconductor substrate 1 and n⁻ buried impurity region 6 (corresponds to Embodiment 1), and when it is $1\times10^{13}$ cm⁻², the peak is at the interface between n⁺ buried impurity region 8 and n⁻ buried impurity region 6 (corresponds to Embodiment 2).

As can be seen from FIG. 36, when the value of l is set to $l \geqq 20$ μm, higher breakdown voltage than in the Embodiment 2 can be obtained in Embodiment 3.

This means that the pattern of n⁻ buried impurity region 6 should be overlapped by at least 20 μm on n⁺ buried impurity region 8, and it can be understood that the breakdown voltage of a semiconductor device can be increased by forming these regions overlapped with each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a low concentration impurity layer of a first conductivity type having a main surface;

a low concentration impurity layer of a second conductivity type formed on said main surface of said low concentration impurity layer of the first conductivity type;

a high concentration impurity region of the second conductivity type formed on a prescribed region of said main surface of said low concentration impurity layer of the first conductivity type so as to be enclosed by said low concentration impurity layer of the first conductivity type and the low concentration impurity layer of the second conductivity type; and a low concentration impurity region of the second conductivity type formed in said low concentration impurity layer of the first conductivity type so as to cover a lower portion of said high concentration impurity region of the second conductivity type, wherein said low and high concentration impurity regions of the second conductivity type extend to depths below the main surface of the low concentration impurity layer of the first conductivity type so that the depth of the low concentration impurity region of said second conductivity type is three times the depth of the high concentration impurity region of the second conductivity type.

2. A semiconductor device according to claim 1, wherein the depth of impurity diffusion of said low concentration impurity region of the second conductivity type from said main surface of said low concentration impurity layer of the first conductivity type extends from a point where an impurity concentration of said high concentration impurity region of the second conductivity type assumes the maximum value to an interface with said low concentration impurity layer of said first conductivity type, in accordance with a log scale.

3. The semiconductor device according to claim 1, wherein, said high concentration impurity region of said second conductivity type has an impurity concentration profile which extends in depth from a position where the impurity concentration assumes the maximum value to a position where a quadratic differential of the concentration assumes a positive maximum value, in accordance with a log scale.

4. A semiconductor device, comprising:

a low concentration impurity layer of a first conductivity type having a main surface;

a low concentration impurity layer of a second conductivity type formed on said main surface of said low concentration impurity layer of the first conductivity type;

a high concentration impurity region of the second conductivity type formed on a prescribed region of said main surface of said low concentration impurity layer of the first conductivity type so as to be enclosed by said low concentration impurity layer of the first conductivity type and the low concentration impurity layer of the second conductivity type; and a low concentration impurity region of the second conductivity type formed in said low concentration impurity layer of the first conductivity type so as to cover a lower portion of said high concentration impurity region of the second conductivity type, wherein said low and high concentration impurity regions of the second conductivity type extend to depths below the main surface of the low concentration impurity layer of the first conductivity type so that the depth of the low concentration impurity region of said second conductivity type is at least three times the depth of the high concentration impurity region of the second conductivity type, wherein said high concentration impurity region of the second conductivity type has a closed planar pattern including ends, each end having an arch which has a radius of at least three times the depth of the high concentration impurity region of the second conductivity type from said main surface of the low concentration impurity layer of the first conductivity type.

5. A semiconductor device, comprising:

a low concentration impurity layer of a first conductivity type having a main surface;

a low concentration impurity layer of a second conductivity type formed on said main surface of said low concentration impurity layer of the first conductivity type;

a high concentration impurity region of the second conductivity type formed on a prescribed region of said main surface of said low concentration impurity layer of the first conductivity type so as to be enclosed by said low concentration impurity layer of the first conductivity type and the low concentration impurity layer of the second conductivity type; and a low concentration impurity region of the second conductivity type formed in said low concentration impurity layer of the first conductivity type so as to cover a lower portion of said high concentration impurity region of the second conductivity type, wherein said low and high concentration impurity regions of the second conductivity type extend to depths below the main surface of the low concentration impurity layer of the first conductivity type so that the depth of the low concentration impurity region of said second conductivity type is at least three times the depth of the high concentration impurity region of the second conductivity type, wherein said low concentration impurity region of the second conductivity type has a closed planar pattern including ends, each end having an arch which has a radius at least three times the depth of the low concentration impurity region of the second conductivity type from said main surface of said low concentration impurity layer of the first conductivity type.

6. A semiconductor device, comprising:

a low concentration impurity layer of a first conductivity type having a main surface;

a low concentration impurity layer of a second conductivity type formed on said main surface of said low concentration impurity layer of the first conductivity type;

a high concentration impurity region of the second conductivity type formed on a prescribed region of said main surface of said low concentration impurity layer of the first conductivity type so as to be enclosed by said low concentration impurity layer of the first conductivity type and the low concentration impurity layer of the second conductivity type; and a low concentration impurity region of the second conductivity type formed in said low concentration impurity layer of the first conductivity type so as to cover a lower portion of said high concentration impurity region of the second conductivity type, wherein said low and high concentration impurity regions of the second conductivity type extend to depths below the main surface of the low concentration impurity layer of the first conductivity type so that the depth of the low concentration impurity region of said second conductivity type is at least three times the depth of the high concentration impurity region of the second conductivity type, wherein said high concentration impurity region of the second conductivity type and said low concentration impurity region of the second conductivity type each have a closed planar pattern including ends, each end have an arch of a prescribed radius and difference in radii of the ends of said high concentration impurity region of the second conductivity type and said low concentration impurity region of said second conductivity type is made larger than the difference between the depth of the low concentration impurity region of the second conductivity type from said main surface of said low concentration impurity layer of the first conductivity type and the depth of the high concentration impurity region of the second conductivity type from said main surface of said low concentration impurity layer of the first conductivity type.

* * * * *